United States Patent
Takayanagi

(10) Patent No.: US 12,550,483 B2
(45) Date of Patent: Feb. 10, 2026

(54) LIGHT-EMITTING DEVICE, PROJECTOR, DISPLAY, AND HEAD-MOUNTED DISPLAY

(71) Applicant: SEIKO EPSON CORPORATION, Tokyo (JP)

(72) Inventor: Kentaro Takayanagi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 336 days.

(21) Appl. No.: 18/186,218

(22) Filed: Mar. 20, 2023

(65) Prior Publication Data

US 2024/0038928 A1 Feb. 1, 2024

(30) Foreign Application Priority Data

Mar. 22, 2022 (JP) ................. 2022-045030

(51) Int. Cl.
*H01L 33/10* (2010.01)
*H10H 20/814* (2025.01)
*H10H 20/825* (2025.01)

(52) U.S. Cl.
CPC ....... *H10H 20/8142* (2025.01); *H10H 20/825* (2025.01)

(58) Field of Classification Search
CPC ............ H10H 20/8142; H10H 20/825; H10H 20/831; H10H 29/142; H10H 20/819; H10H 20/833; H10H 20/835; H10H 20/83; H10H 20/84; H10H 20/841; H10H 20/856; H01L 25/0753; G03B 21/2033; G02B 27/0101; G09F 9/33; H01S 5/0285; H01S 5/20; H01S 5/2018; H01S 5/30
See application file for complete search history.

(56) References Cited

U.S. PATENT DOCUMENTS

| | | | |
|---|---|---|---|
| 10,297,722 B2 | 5/2019 | Chang et al. | |
| 2016/0351755 A1* | 12/2016 | Lee | H10H 20/856 |
| 2020/0168777 A1* | 5/2020 | Kang | H10H 20/857 |
| 2020/0176655 A1 | 6/2020 | Iguchi et al. | |
| 2021/0151422 A1 | 5/2021 | Iguchi et al. | |

FOREIGN PATENT DOCUMENTS

| | | |
|---|---|---|
| JP | 2020088383 | 6/2020 |
| JP | 2021082687 | 5/2021 |
| WO | 2020243198 | 12/2020 |

* cited by examiner

*Primary Examiner* — Mohammed R Alam
(74) *Attorney, Agent, or Firm* — JCIPRNET

(57) ABSTRACT

A light-emitting device includes: a first semiconductor layer having a first electric conductivity type; a second semiconductor layer provided between the first semiconductor layer and a second electrode and having a second electric conductivity type; a light-emitting layer provided between the first semiconductor layer and the second semiconductor layer; an insulating layer provided along a side surface of the first semiconductor layer; and a metal layer provided in contact with the insulating layer and along the side surface of the first semiconductor layer and that reflects light outputted from the first electrode side. The metal layer includes a first end in a first direction directed from the light-emitting layer toward the first semiconductor layer. The first semiconductor layer includes a second end in the first direction. In the first direction, a position of the first end is equal to or different from a position of the second end.

9 Claims, 29 Drawing Sheets

LIGHT-EMITTING DEVICE, PROJECTOR, DISPLAY, AND HEAD-MOUNTED DISPLAY

The present application is based on, and claims priority from JP Application Serial Number 2022-045030, filed on Mar. 22, 2022, the disclosure of which is hereby incorporated by reference herein in its entirety.

BACKGROUND

1. Technical Field

The present disclosure relates to a light-emitting device, a projector, a display, and a head-mounted display.

2. Related Art

A light-emitting diode (LED) is used as a light source in a projector, a head-mounted display, or the like.

For example, JP-A-2021-82687 describes an image displaying element in which micro light-emitting elements are arranged in an array manner. Each of the micro light-emitting elements includes an excited light-emitting element configured to generate excited light, and a reflective wall that surrounds the excited light-emitting element. The excited light-emitting element includes a main body obtained by dividing a nitride semiconductor layer, an N electrode, and a transparent electrode. The entire side surface of the main body is covered with a transparent insulating film, and the transparent electrode covers the transparent insulating film.

However, in a case of the micro light-emitting element described in JP-A-2021-82687, the reflective wall is separated from the transparent insulating film, which leads to an increase in the size of the element. As the size of the element increases, the elements cannot be arranged in a highly dense manner, which cannot achieve high density of pixels.

SUMMARY

An aspect of a light-emitting device according to the present disclosure includes a first electrode, a second electrode, a first semiconductor layer provided between the first electrode and the second electrode and having a first electric conductivity type, a second semiconductor layer provided between the first semiconductor layer and the second electrode and having a second electric conductivity type different from the first electric conductivity type, a light-emitting layer provided between the first semiconductor layer and the second semiconductor layer, an insulating layer provided along a side surface of the first semiconductor layer, and a metal layer provided in contact with the insulating layer and along the side surface of the first semiconductor layer and configured to reflect light generated at the light-emitting layer, wherein the light generated at the light-emitting layer is outputted from a side of the first electrode, the metal layer includes a first end in a first direction directed from the light-emitting layer toward the first semiconductor layer, the first semiconductor layer includes a second end in the first direction, and in the first direction, a position of the first end is equal to a position of the second end or the position of the first end is on a first direction side with respect to the position of the second end.

An aspect of a projector according to the present disclosure includes the aspect of the light-emitting device.

An aspect of a display according to the present disclosure includes the aspect of the light-emitting device.

An aspect of a head-mounted display according to the present disclosure includes the aspect of the light-emitting device.

DESCRIPTION OF EXEMPLARY EMBODIMENTS

Below, preferred embodiments according to the present disclosure will be described in detail with reference to the drawings. Note that the embodiments described below are not intended to disadvantageously limit details of the present disclosure described in the scope of Claims. In addition, not all the configurations described below are essential constituent requirements of the present disclosure.

1. First Embodiment

1.1. Light-Emitting Device

Figure 1:
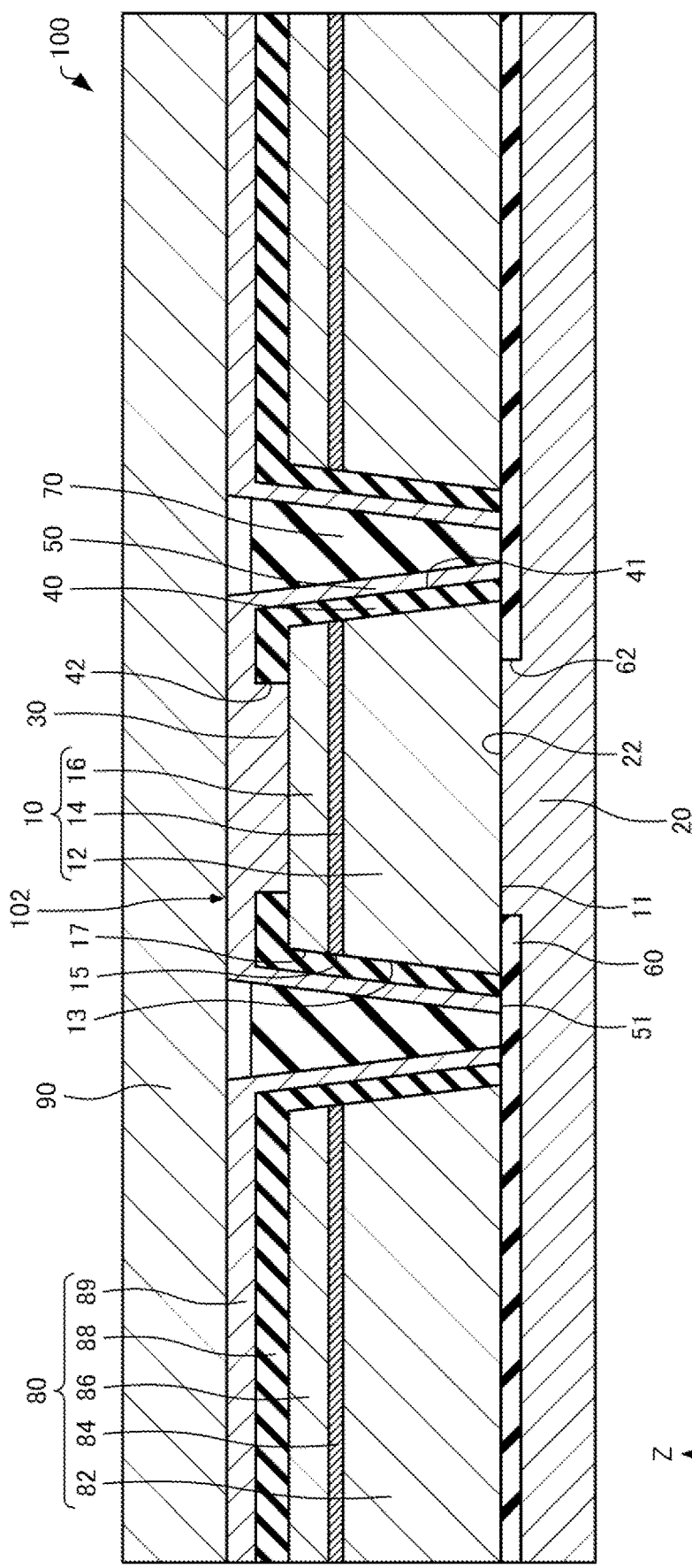
FIG. 1 is a cross-sectional view schematically illustrating a light-emitting device according to a first embodiment.

First, a light-emitting device according to the first embodiment will be described with reference to the drawings. FIG. 1 is a cross-sectional view schematically illustrating a light-emitting device 100 according to the first embodiment. Note that, in FIG. 1, the X-axis, the Y-axis, and the Z-axis are illustrated as three axes perpendicular to each other.

The light-emitting device 100 includes, for example, a layered body 10, a first electrode 20, a second electrode 30, a first insulating layer 40, a metal layer 50, a second insulating layer 60, a third insulating layer 70, a structural body 80, and a wiring substrate 90, as illustrated in FIG. 1. The light-emitting device 100 is, for example, an LED.

The layered body 10 is provided between the first electrode 20 and the second electrode 30. In the example illustrated in the drawing, the shape of the layered body 10 is a trapezoid shape. The upper surface of the layered body 10 is smaller than the lower surface of the layered body 10. Side surfaces of the layered body 10 are inclined relative to the lower surface of the layered body 10. In the example illustrated in the drawing, the lower surface of the layered body 10 is parallel to the XY plane. The diameter of the layered body 10 increases toward the −Z-axis direction.

Note that, the expression "diameter of the layered body 10" represents a diameter when the planar shape of the layered body 10 is a circle, and represents a diameter of the minimum bounding circle when the planar shape of the layered body 10 is not a circle. For example, when the planar shape of the layered body 10 is a polygonal shape, the diameter of the layered body 10 is the diameter of the minimum circle containing the polygonal shape within it. When the planar shape of the layered body 10 is an ellipse shape, the diameter of the layered body 10 is the diameter of the minimum circle containing the ellipse shape within it. This similarly applies to the expression "diameter of the column portion 202" described below.

The layered body 10 includes a first semiconductor layer 12, a light-emitting layer 14, and a second semiconductor layer 16.

The first semiconductor layer 12 is provided on the first electrode 20. The first semiconductor layer 12 is provided between the first electrode 20 and the light-emitting layer 14. The first semiconductor layer 12 is provided between the first electrode 20 and the second electrode 30. The first semiconductor layer 12 includes a side surface 13. The side surface 13 is inclined relative to the lower surface of the layered body 10. The side surface 13 constitutes a side surface of the layered body 10.

Note that, in the present specification, description will be made such that, in a direction (hereinafter, also simply referred to as a "layered direction") in which the layered body 10 is layered, a direction from the light-emitting layer 14 toward the second semiconductor layer 16 is referred to as an "upward", and a direction from the light-emitting layer 14 toward the first semiconductor layer 12 is referred to as a "downward", when the light-emitting layer 14 is used as a reference. In addition, a direction perpendicular to the layered direction is also referred to as an "in-plane direction". The term "layered direction of the layered body 10" represents a direction in which the first semiconductor layer 12 and the light-emitting layer 14 are layered. In the example illustrated in the drawing, the layered direction is the Z-axis direction. In addition, a direction from the light-emitting layer 14 toward the first semiconductor layer 12 is also referred to as a "first direction". In the example illustrated in the drawing, the first direction is the −Z-axis direction.

The thickness of the first semiconductor layer 12 falls, for example, in a range not less than 3 µm and not more than 20 µm, and may fall in a range not less than 5 µm and not more than 10 µm. In the example illustrated in the drawing, the thickness of the first semiconductor layer 12 is greater than the thickness of the light-emitting layer 14 and the thickness of the second semiconductor layer 16. The first semiconductor layer 12 is a semiconductor layer having a first electric conductivity type. The first semiconductor layer 12 is, for example, an n-type GaN layer in which Si is doped.

Note that, although illustration is not given, the first semiconductor layer 12 may include a strain relaxation layer in contact with the first electrode 20. The strain relaxation layer is, for example, an AlN layer. The lattice constant of the strain relaxation layer is a value that falls between the lattice constant of the GaN layer and the lattice constant of a first substrate 5 that will be described later. The strain relaxation layer may include, for example, a strained layer superlattice (SLS) in which the GaN layer and the AlN layer are alternately layered. The strain relaxation layer makes it possible to reduce crystal defect of the GaN layer of the first semiconductor layer 12. This makes it possible to improve efficiency in emitting light.

The light-emitting layer 14 is provided on the first semiconductor layer 12. The light-emitting layer 14 is provided between the first semiconductor layer 12 and the second semiconductor layer 16. The light-emitting layer 14 includes a side surface 15. The side surface 15 continues to the side surface 13 of the first semiconductor layer 12. The side surface 15 constitutes the side surface of the layered body 10.

With a current being inputted, the light-emitting layer 14 generates light. The light-emitting layer 14 includes, for example, a well layer and a barrier layer. Each of the well layer and the barrier layer is an i-type semiconductor layer in which impurities are not intentionally doped. The well layer is, for example, an InGaN layer. The barrier layer is, for example, a GaN layer. The light-emitting layer 14 has a multiple quantum well (MQW) structure including the well layer and the barrier layer.

Note that there is no specific limitation as to the number of well layers and the barrier layers that constitute the light-emitting layer 14. For example, it may be possible to employ a configuration in which the number of the well layers provided is only one. In this case, the light-emitting layer 14 has a single quantum well (SQW) structure.

The second semiconductor layer 16 is provided on the light-emitting layer 14. The second semiconductor layer 16 is provided between the light-emitting layer 14 and the second electrode 30. The second semiconductor layer 16 is provided between the first semiconductor layer 12 and the second electrode 30. The second semiconductor layer 16 includes a side surface 17. The side surface 17 continues to the side surface 15 of the light-emitting layer 14. The side surface 17 constitutes a side surface of the layered body 10. The second semiconductor layer 16 is a semiconductor layer having a second electric conductivity type different from the first electric conductivity type. The second semiconductor layer 16 is, for example, a p-type GaN layer in which Mg is doped.

In the light-emitting device 100, a pin diode is comprised of the p-type second semiconductor layer 16, the i-type light-emitting layer 14 in which impurities are not intentionally doped, and the n-type first semiconductor layer 12. In the light-emitting device 100, when a forward-bias voltage of the pin diode is applied across the first electrode 20 and the second electrode 30, a current is injected into the light-emitting layer 14, which causes re-combination of electrons and positive holes in the light-emitting layer 14. As a result of this re-combination, light emission occurs.

The first electrode 20 is provided below the first semiconductor layer 12. The first electrode 20 includes a contact surface 22 with the first semiconductor layer 12. The contact surface 22 constitutes the upper surface of the first electrode 20. The contact surface 22 constitutes an end of the first electrode 20 in the +Z-axis direction. Here, FIG. 2 is a plan view schematically illustrating the contact surface 22, the first semiconductor layer 12, and the light-emitting layer 14.

Figure 2:
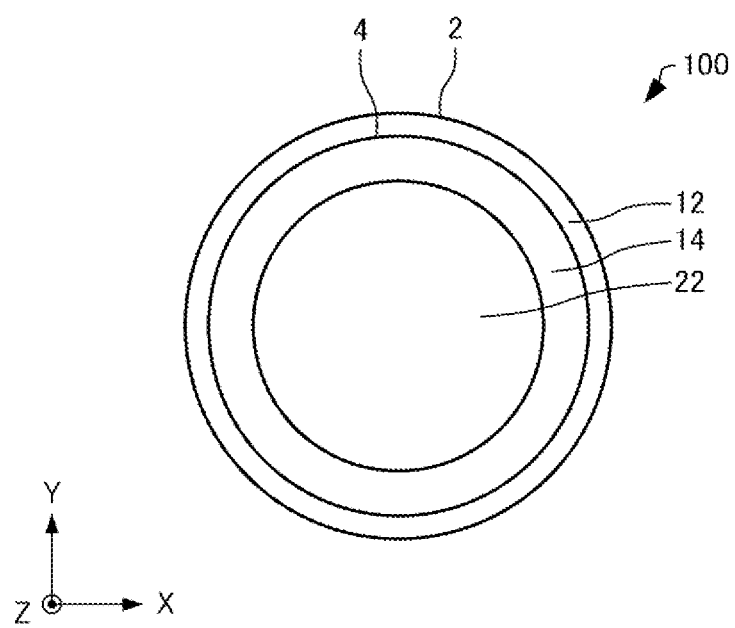
FIG. 2 is a plan view schematically illustrating the light-emitting device according to the first embodiment.

The contact surface 22 of the first electrode 20 is provided at an inner side of the outer edge 2 of the first semiconductor layer 12 as viewed from the −Z-axis direction, as illustrated in FIG. 2. The contact surface 22 is not provided at an outer side of the outer edge 2. The contact surface 22 is provided at an inner side of the outer edge 4 of the light-emitting layer 14 as viewed from the −Z-axis direction. The contact surface 22 is not provided at an outer side of the outer edge 4. The contact surface 22 is spaced apart from the outer edge 2, 4. As viewed from the −Z-axis direction, the area of the contact surface 22 is smaller than the area of the first semiconductor layer 12 and the area of the light-emitting layer 14. The area of the light-emitting layer 14 is smaller than the area of the first semiconductor layer 12. The outer edge 4 is provided at an inner side of the outer edge 2. In the example illustrated in the drawing, the planar shape of each of the contact surface 22, the first semiconductor layer 12, and the light-emitting layer 14 is a circle shape.

The first electrode 20 is an electrode at one side used to inject a current into the light-emitting layer 14. The first semiconductor layer 12 may be in ohmic contact with the first electrode 20. The first electrode 20 is, for example, a transparent electrode made of indium tin oxide (ITO) or ZnO. The light generated at the light-emitting layer 14 passes through the first electrode 20, and is outputted from the first electrode 20 side.

The second electrode 30 is provided on the second semiconductor layer 16, as illustrated in FIG. 1. In addition, the second electrode 30 is provided on the first insulating layer 40. The second electrode 30 is provided between the second semiconductor layer 16 and the wiring substrate 90. In the example illustrated in the drawing, the second electrode 30 is in contact with the second semiconductor layer 16.

The second electrode 30 is an electrode at the other side used to inject a current into the light-emitting layer 14. The second semiconductor layer 16 may be in ohmic contact with the second electrode 30. The second electrode 30 is made, for example, of metal. For the second electrode 30, an electrode or the like obtained by layering an Ni layer and an Au layer in this order from the second semiconductor layer 16 side is used, for example. The second electrode 30 reflects the light generated at the light-emitting layer 14 toward the first electrode 20 side.

The first insulating layer 40 is provided along the side surface 13 of the first semiconductor layer 12. In the example illustrated in the drawing, the first insulating layer 40 is further provided at the side surface 15 of the light-emitting layer 14, the side surface 17 of the second semiconductor layer 16, and the upper surface of the second semiconductor layer 16. The first insulating layer 40 covers, for example, the entire side surface of the layered body 10. The first insulating layer 40 surrounds, for example, the layered body 10 as viewed from the −Z-axis direction. The first insulating layer 40 is, for example, an aluminum oxide ($Al_2O_3$) layer or a silicon oxide ($SiO_2$) layer.

The first insulating layer 40 includes a side surface 41. In the example illustrated in the drawing, the side surface 41 is inclined relative to the lower surface of the layered body 10. The side surface 41 is parallel to the side surface 13 of the first semiconductor layer 12, for example.

The first insulating layer 40 includes a contact hole 42. In the example illustrated in the drawing, the bottom surface of the contact hole 42 is defined by the second semiconductor layer 16. The second electrode 30 is provided in the contact hole 42.

The metal layer 50 is provided at the side surface 41 of the first insulating layer 40. The metal layer 50 is in contact with the side surface 41 of the first insulating layer 40. The metal layer 50 surrounds, for example, the first insulating layer 40 as viewed from the −Z-axis direction.

The metal layer 50 is coupled, for example, to the second electrode 30. The metal layer 50 is provided, for example, so as to be integrated with the second electrode 30. This makes it possible to form the second electrode 30 and the metal layer 50 in the same process. Thus, it is possible to reduce the manufacturing process, as compared with a case where the second electrode and the metal layer are formed in separate processes.

The metal layer 50 includes a first end 51 in the −Z-axis direction. The first end 51 is an end of the metal layer 50 that is located furthest in the −Z-axis direction. In the example illustrated in the drawing, the first end 51 is an end of the metal layer 50 on the first electrode 20 side. The first semiconductor layer 12 includes a second end 11 in the −Z-axis direction. The second end 11 is an end of the first semiconductor layer 12 that is located furthest in the −Z-axis direction. In the example illustrated in the drawing, the second end 11 is an end of the first semiconductor layer 12 on the first electrode 20 side.

In the Z-axis direction, the position of the first end 51 of the metal layer 50 is the same as the position of the second end 11 of the first semiconductor layer 12. In the layered direction, the position of the first end 51 is the same as the position of the second end 11. In the example illustrated in the drawing, the first end 51 is in contact with the second insulating layer 60. The second end 11 constitutes the lower surface of the first semiconductor layer 12. The second end 11 is in contact with the first electrode 20 as well as the second insulating layer 60.

The metal layer 50 is made of metal. For example, the material of the metal layer 50 is the same as that of the second electrode 30. The metal layer 50 reflects light generated at the light-emitting layer 14. As the light generated at the light-emitting layer 14 is reflected by the metal layer 50 and the second electrode 30, the light generated at the light-emitting layer 14 is outputted from the first electrode 20 side. The layered body 10, the first electrode 20, the second electrode 30, the first insulating layer 40, and the metal layer 50 constitute a light-emitting element 102. The metal layer 50 is provided along the side surface 13 of the first semiconductor layer 12. There is no particular limitation as to the angle of inclination of the side surface 13 of the first semiconductor layer 12 relative to the lower surface of the layered body 10. It is only necessary that the light reflected by the metal layer 50 is outputted from the first electrode 20 side.

The second insulating layer 60 is provided on the first electrode 20. The second insulating layer 60 is provided between the first electrode 20 and the first semiconductor layer 12. The second insulating layer 60 surrounds, for example, the contact surface 22 of the first electrode 20 as viewed from the −Z-axis direction. The second insulating layer 60 is, for example, a silicon oxide layer.

The second insulating layer 60 includes a contact hole 62. In the example illustrated in the drawing, the bottom surface of the contact hole 62 is defined by the first semiconductor layer 12. The first electrode 20 is provided in the contact hole 62.

The third insulating layer 70 is provided on the second insulating layer 60. The third insulating layer 70 is provided between the second insulating layer 60 and the wiring substrate 90. In the example illustrated in the drawing, the third insulating layer 70 is separated from the wiring substrate 90. The third insulating layer 70 surrounds, for example, the light-emitting element 102 as viewed from the −Z-axis direction. The metal layer 50 is provided between the first insulating layer 40 and the third insulating layer 70. In the example illustrated in the drawing, the third insulating layer 70 is in contact with the metal layer 50.

The material of the third insulating layer 70 is, for example, a silicon oxide. For example, even when there is light generated at the light-emitting layer 14 and passing through the metal layer 50, it is possible to reflect this light toward the layered body 10 side at an interface between the third insulating layer 70 and the metal layer 50.

The structural body 80 is provided on the second insulating layer 60. The structural body 80 is provided between the second insulating layer 60 and the wiring substrate 90. The structural body 80 is separated from the layered body 10. The structural body 80 surrounds, for example, the layered body 10 as viewed from the −Z-axis direction. The third insulating layer 70 is provided between the structural body 80 and the layered body 10.

The structural body 80 includes, for example, a third semiconductor layer 82, an MQW layer 84, a fourth semiconductor layer 86, a fourth insulating layer 88, and a metal layer 89.

The third semiconductor layer 82 is provided on the second insulating layer 60. The third semiconductor layer 82 is provided between the second insulating layer 60 and the MQW layer 84. The third semiconductor layer 82 is separated from the first electrode 20. The third semiconductor layer 82 is not electrically coupled to the first electrode 20. The material of the third semiconductor layer 82 is the same as that of the first semiconductor layer 12.

The MQW layer 84 is provided on the third semiconductor layer 82. The MQW layer 84 is provided between the third semiconductor layer 82 and the fourth semiconductor layer 86. The MQW layer 84 has the same MQW structure as the light-emitting layer 14. The material of the MQW layer 84 is the same as that of the light-emitting layer 14. The third semiconductor layer 82 is not electrically coupled to the first electrode 20, and the fourth semiconductor layer 86 is not electrically coupled to the second electrode 30. Thus, no current is injected into the MQW layer 84. For this reason, the MQW layer 84 does not emit light.

The fourth semiconductor layer 86 is provided on the MQW layer 84. The fourth semiconductor layer 86 is provided between the MQW layer 84 and the fourth insulating layer 88. The fourth semiconductor layer 86 is separated from the second electrode 30. The fourth semiconductor layer 86 is not electrically coupled to the second electrode 30. The material of the fourth semiconductor layer 86 is the same as that of the second semiconductor layer 16.

The fourth insulating layer 88 is provided at the upper surface of the fourth semiconductor layer 86, a side surface of the fourth semiconductor layer 86, a side surface of the MQW layer 84, and a side surface of the third semiconductor layer 82. In the example illustrated in the drawing, the fourth insulating layer 88 is in contact with the second insulating layer 60. The material of the fourth insulating layer 88 is the same as that of the first insulating layer 40.

The metal layer 89 is provided at the upper surface and a side surface of the fourth insulating layer 88. In the example illustrated in the drawing, the metal layer 89 is in contact with the second insulating layer 60. The material of the metal layer 89 is the same as that of the metal layer 50.

The wiring substrate 90 is provided on the second electrode 30. In the example illustrated in the drawing, the wiring substrate 90 is further provided on the metal layer 89. A driving circuit used to drive the light-emitting element 102 is mounted at the wiring substrate 90. The driving circuit is configured to include, for example, a thin film transistor (TFT), and a complementary metal oxide semiconductor (CMOS).

The light-emitting device 100 provides the following operation and effect, for example.

The light-emitting device 100 includes: the first electrode 20; the second electrode 30; the first semiconductor layer 12 provided between the first electrode 20 and the second electrode 30 and having a first electric conductivity type; the second semiconductor layer 16 provided between the first semiconductor layer 12 and the second electrode 30 and having a second electric conductivity type different from the first electric conductivity type; the light-emitting layer 14 provided between the first semiconductor layer 12 and the second semiconductor layer 16; the first insulating layer 40 provided along the side surface 13 of the first semiconductor layer 12; and the metal layer 50 provided in contact with the first insulating layer 40 and along the side surface 13 of the first semiconductor layer 12, and configured to reflect light generated at the light-emitting layer 14. The light generated at the light-emitting layer 14 is outputted from the first electrode 20 side. The metal layer 50 includes the first end 51 in the −Z-axis direction serving as the first direction directed from the light-emitting layer 14 toward the first semiconductor layer 12. The first semiconductor layer 12 includes the second end 11 in the −Z-axis direction. In the −Z-axis direction, the position of the first end 51 is equal to the position of the second end 11.

Thus, with the light-emitting device 100, it is possible to reduce the size thereof, as compared with a case where the metal layer and the first insulating layer are separated from each other. For this reason, it is possible to arrange light-emitting devices 100 in a highly dense manner, which makes it possible to achieve high density of pixels.

In addition, in the light-emitting device 100, the metal layer 50 is in contact with the first insulating layer 40 provided at the side surface 13 of the first semiconductor layer 12. Thus, it is possible to provide the metal layer 50 at a correct position relative to the layered body 10, as compared with a case where the metal layer is separated from the first insulating layer.

Furthermore, with the light-emitting device 100, it is possible to reduce light outputted from the side surface of the layered body 10, as compared with a case where the first end of the metal layer is located further in the +Z-axis direction than the second end of the first semiconductor layer. Thus, it is possible to efficiently output light from the first electrode 20 side.

In the light-emitting device 100, the contact surface 22 with the first semiconductor layer 12 of the first electrode 20 is provided at an inner side of the outer edge 2 of the first semiconductor layer 12, as viewed from the −Z-axis direction. Thus, with the light-emitting device 100, it is possible to reduce a current flowing in the side surface of the first semiconductor layer 12, as compared, for example, with a case where the contact surface is in contact with the outer edge of the first semiconductor layer. This makes it possible to improve efficiency of the current injection. The side surface of the first semiconductor layer 12 is more likely to be damaged due to etching, and a current is less likely to flow.

In the light-emitting device 100, the contact surface 22 is provided at an inner side of the outer edge 4 of the light-emitting layer 14, as viewed from the −Z-axis direction. Thus, with the light-emitting device 100, it is possible to reduce a current flowing in the side surface of the first semiconductor layer 12, as compared, for example, with a case where the contact surface is in contact with the outer edge of the light-emitting layer.

In the light-emitting device 100, the first insulating layer 40 is further provided at the side surface 15 of the light-emitting layer 14 and the side surface 17 of the second semiconductor layer 16, and the metal layer 50 is coupled to the second electrode 30. Thus, with the light-emitting device 100, for example, it is possible to reflect, by the metal layer 50, light emitted at the light-emitting layer 14 and passing through the side surface 17 of the second semiconductor layer 16.

1.2. Method of Manufacturing Light-Emitting Device

Next, a method of manufacturing the light-emitting device 100 according to the first embodiment will be described with reference to the drawings. FIGS. 3 to 15 are cross-sectional views each schematically illustrating a process of manufacturing the light-emitting device 100 according to the first embodiment.

Figure 3:
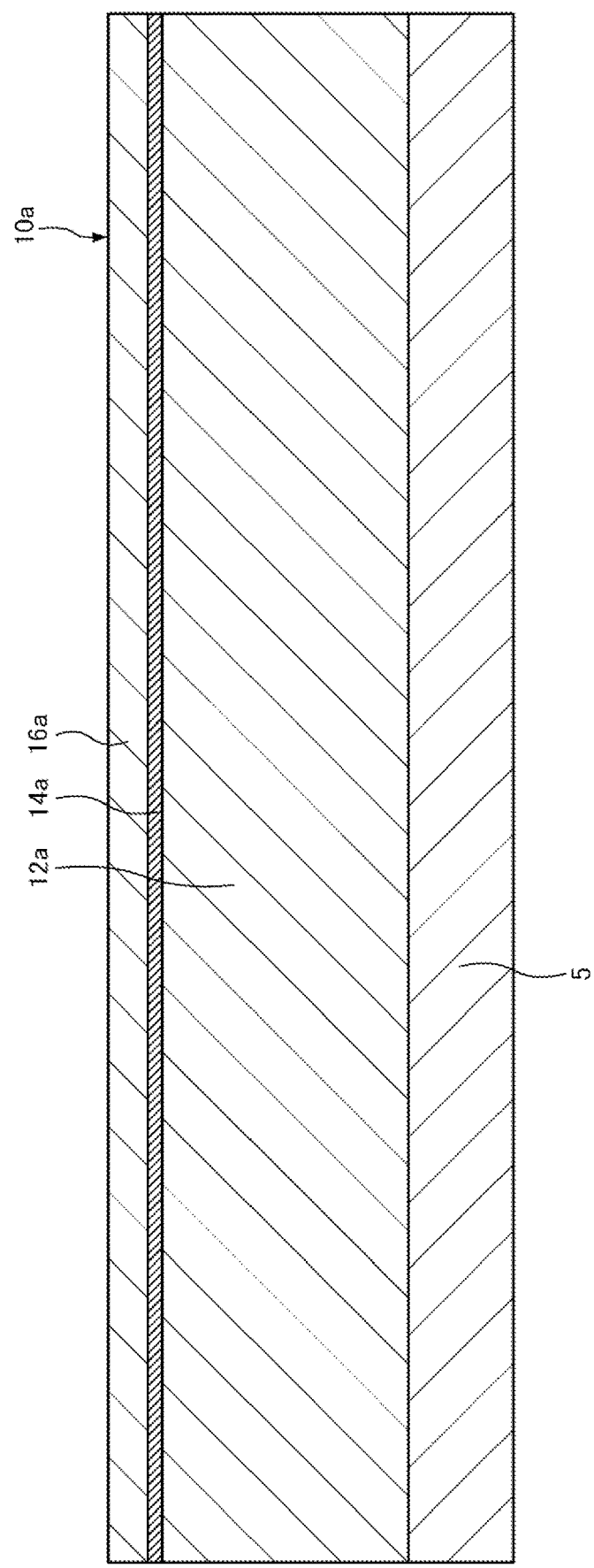
FIG. 3 is a cross-sectional view schematically illustrating a process of manufacturing the light-emitting device according to the first embodiment.

As illustrated in FIG. 3, a semiconductor layer 12a, an MQW layer 14a, and a semiconductor layer 16a are caused to epitaxial grow at the first substrate 5 in this order, to form a layered body 10a. Examples of the method used to epitaxial grow includes a metal organic chemical vapor deposition (MOCVD) method and a molecular beam epitaxy (MBE) method. Examples of the first substrate 5 includes a sapphire substrate, an Si substrate, a GaN substrate, and an SiC substrate. Note that the semiconductor layer 12a may be caused to grow using an epitaxial lateral overgrowth (ELO) method. This makes it possible to form the semiconductor layer 12a having reduced crystal defect.

Figure 4:
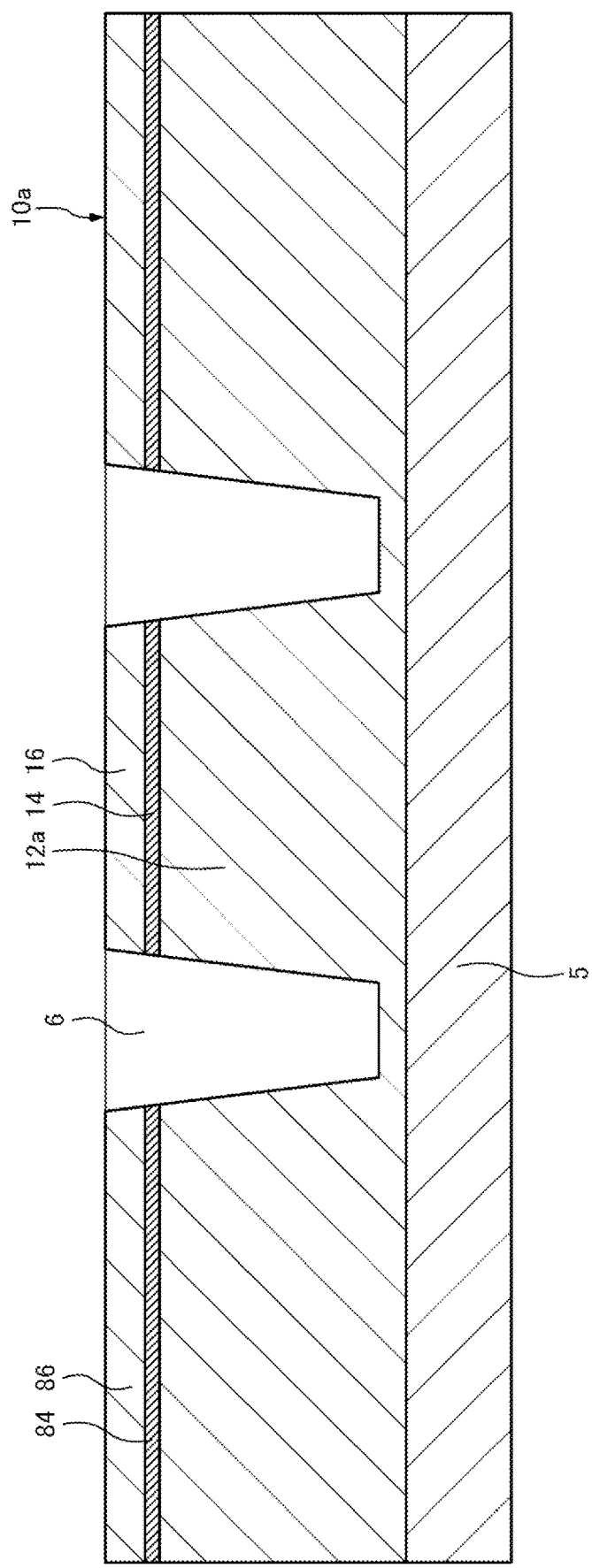
FIG. 4 is a cross-sectional view schematically illustrating a process of manufacturing the light-emitting device according to the first embodiment.

As illustrated in FIG. 4, the layered body 10a is patterned from the semiconductor layer 16a side to form an opening portion 6. This patterning is performed, for example, through photolithography and etching. The etching may be performed only through dry etching or may be performed in combination of dry etching and wet etching. The opening portion 6 extends through the semiconductor layer 16a and the MQW layer 14a. In the example illustrated in the drawing, the opening portion 6 does not completely extend through the semiconductor layer 12a. This step makes it possible to form the light-emitting layer 14 and the MQW layer 84 each made out of the MQW layer 14a. In addition, it is possible to form the second semiconductor layer 16 and the fourth semiconductor layer 86 each made out of the semiconductor layer 16a.

Figure 5:
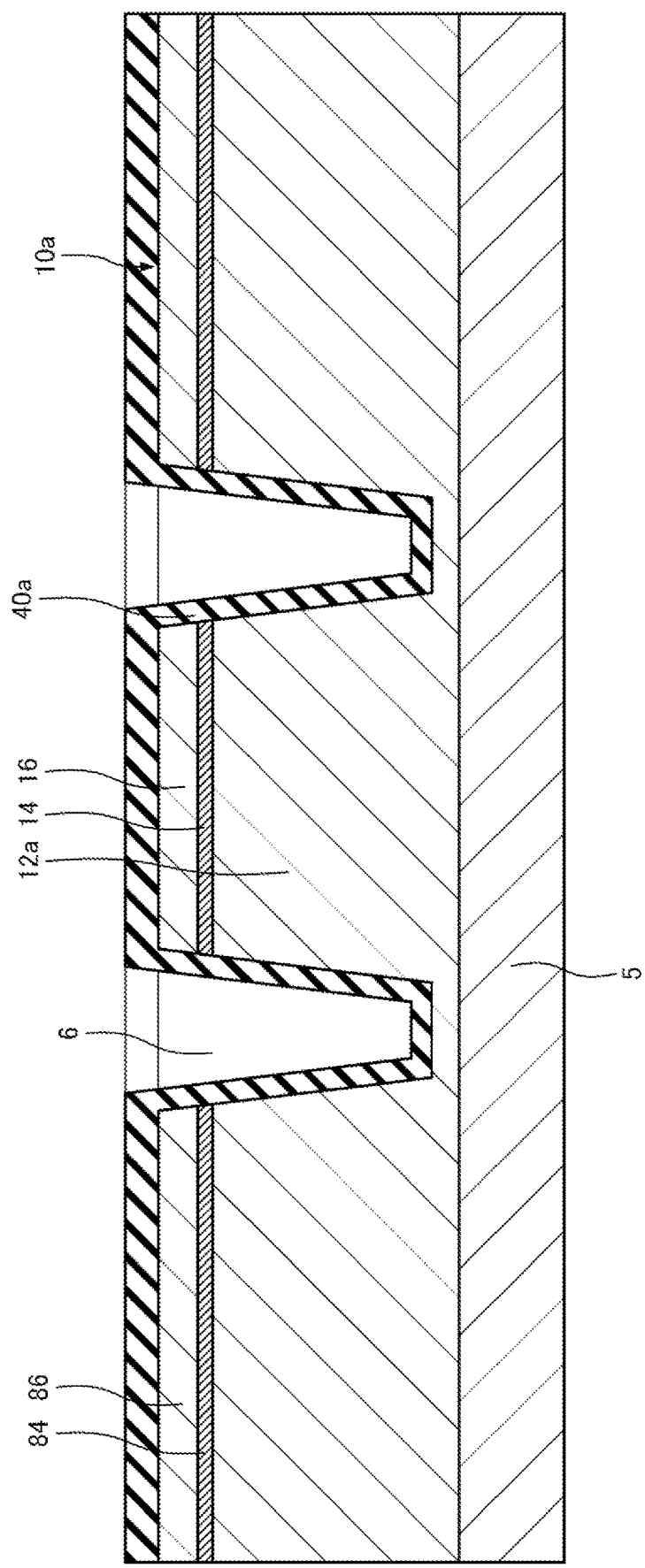
FIG. 5 is a cross-sectional view schematically illustrating a process of manufacturing the light-emitting device according to the first embodiment.

As illustrated in FIG. 5, an insulating layer 40a is formed at the upper surface of the layered body 10a and the side surface of the layered body 10a that defines the opening portion 6. The insulating layer 40a is formed, for example, through an atomic layer deposition (ALD) method or a chemical vapor deposition (CVD) method.

Figure 6:
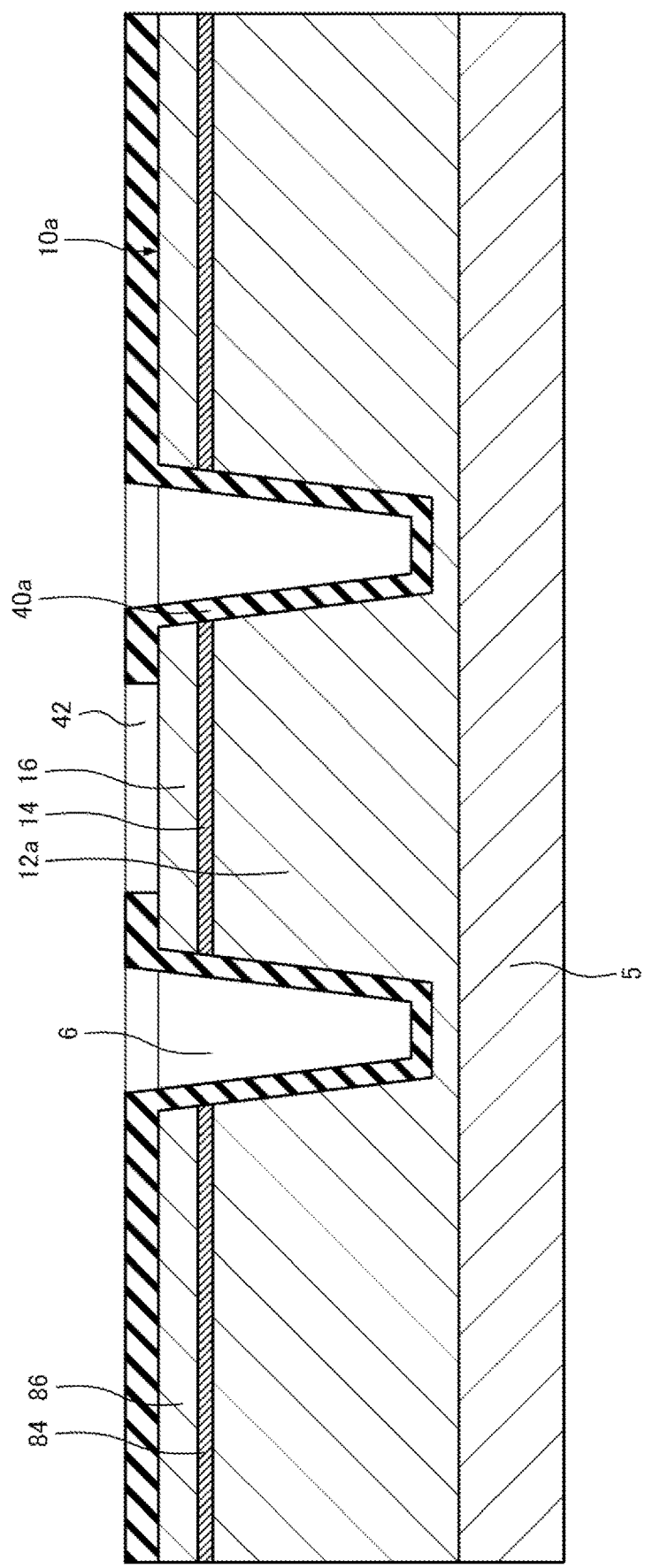
FIG. 6 is a cross-sectional view schematically illustrating a process of manufacturing the light-emitting device according to the first embodiment.

As illustrated in FIG. 6, the insulating layer 40a is patterned to form the contact hole 42. This patterning is performed, for example, through photolithography and etching. Through this process, the second semiconductor layer 16 is exposed.

Figure 7:
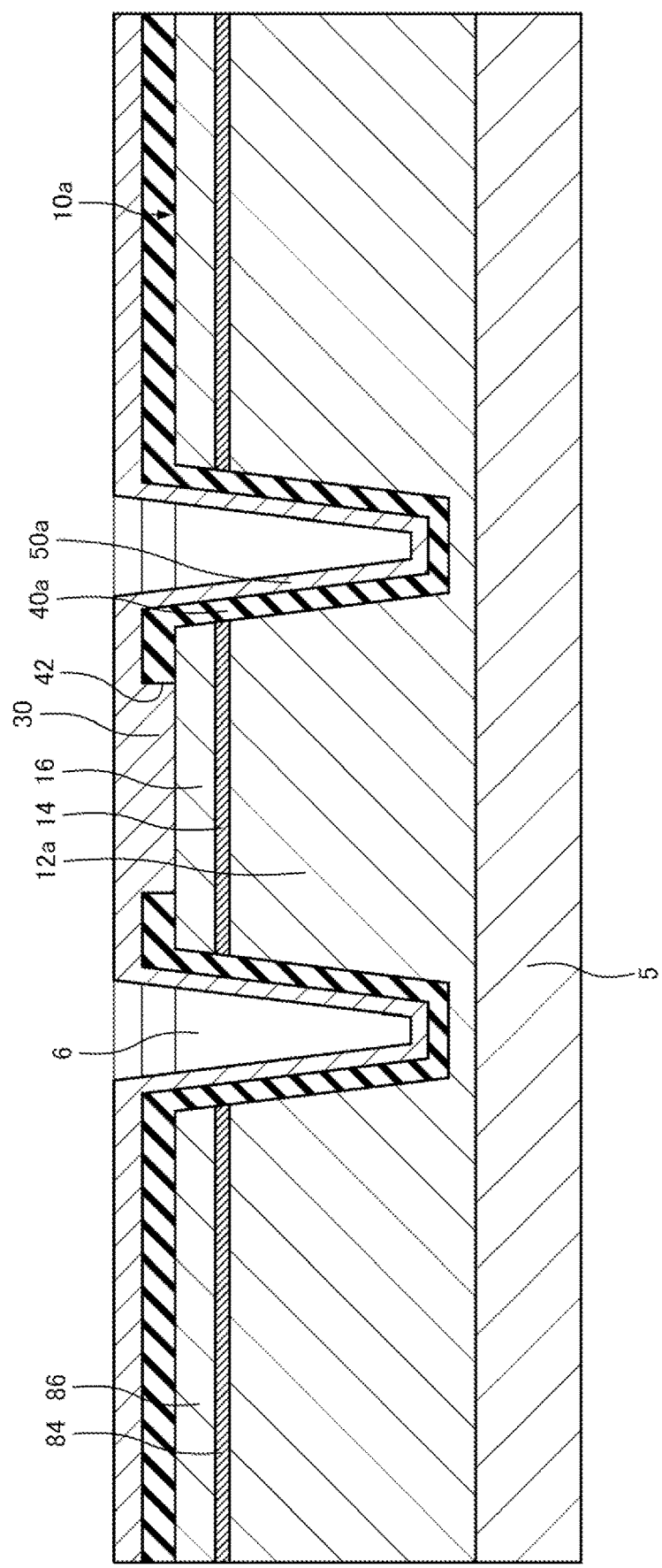
FIG. 7 is a cross-sectional view schematically illustrating a process of manufacturing the light-emitting device according to the first embodiment.

As illustrated in FIG. 7, a metal layer 50a is formed at the upper surface of the second semiconductor layer 16, the upper surface of the insulating layer 40a, and a side surface of the insulating layer 40a. The metal layer 50a is formed, for example, through vacuum deposition. This process makes it possible to form the second electrode 30 made out of the metal layer 50a on the second semiconductor layer 16.

Figure 8:
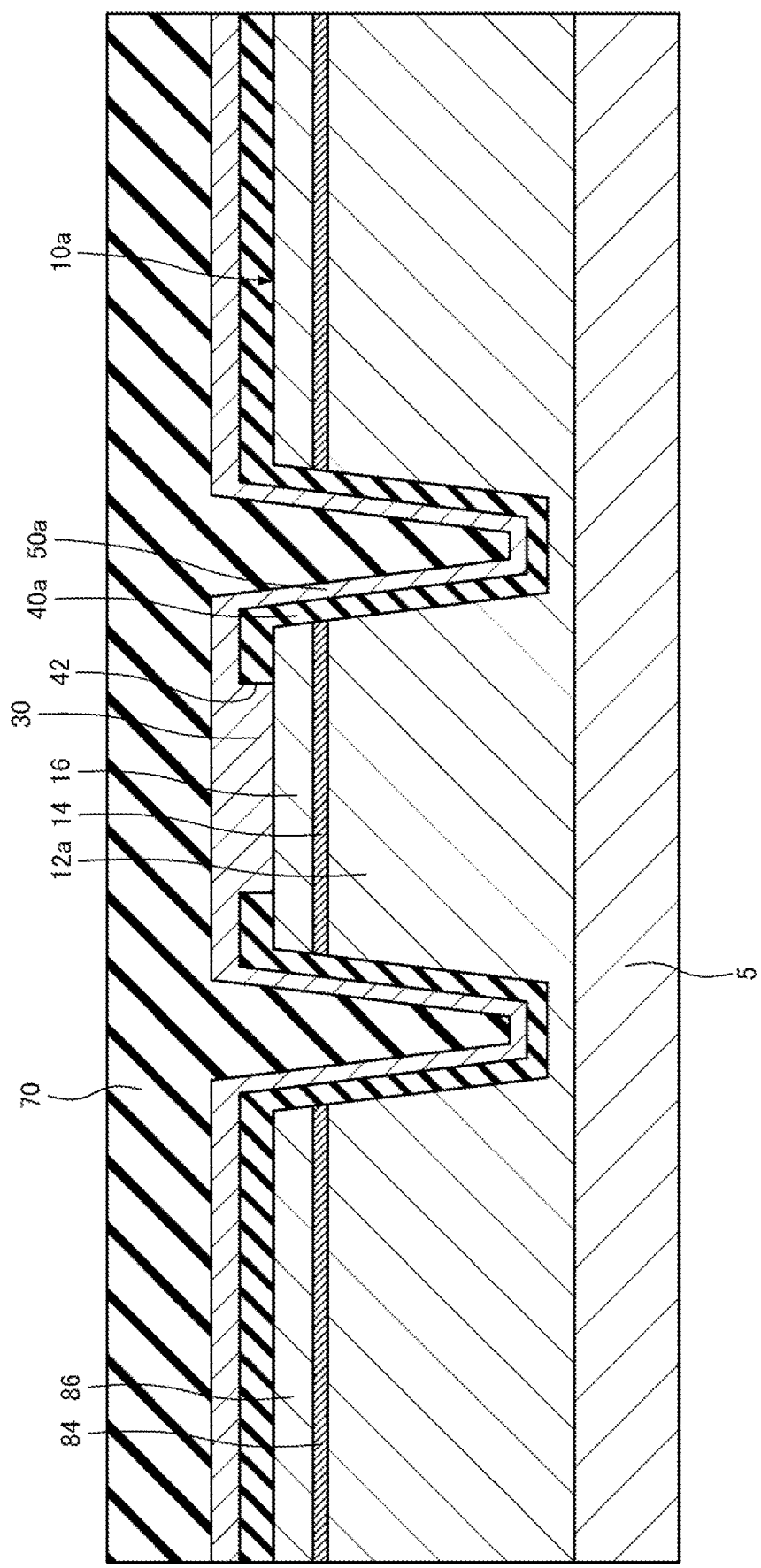
FIG. 8 is a cross-sectional view schematically illustrating a process of manufacturing the light-emitting device according to the first embodiment.

As illustrated in FIG. 8, the third insulating layer 70 is formed at the metal layer 50a and the opening portion 6. The third insulating layer 70 is formed so as to fill the opening portion 6. The third insulating layer 70 is formed, for example, through a spin coating method, a CVD method, or ALD method.

Figure 9:
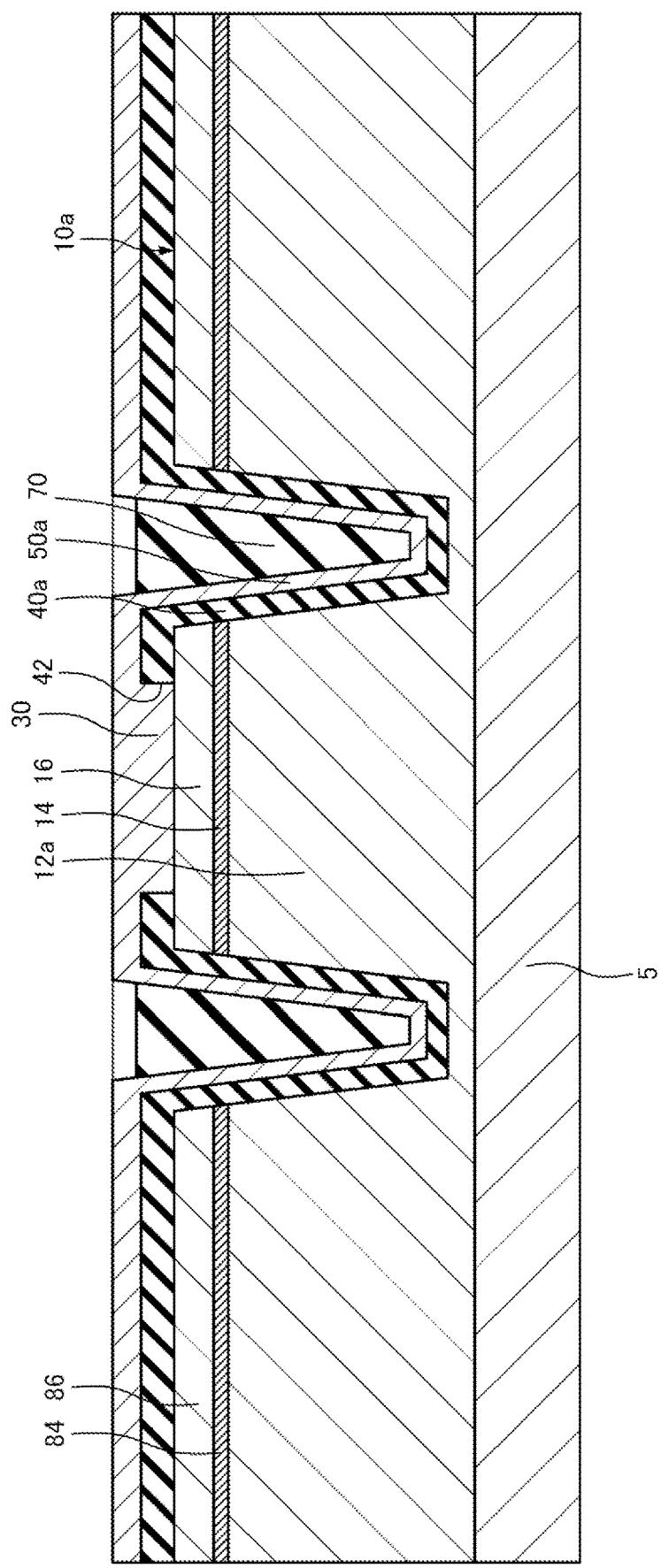
FIG. 9 is a cross-sectional view schematically illustrating a process of manufacturing the light-emitting device according to the first embodiment.

A portion of the third insulating layer 70 that is provided on the metal layer 50a is removed, as illustrated in FIG. 9. This removal of the third insulating layer 70 is performed such that the third insulating layer 70 is left at the opening portion 6. This removal of the third insulating layer 70 is performed, for example, through chemical mechanical polishing (CMP).

Figure 10:
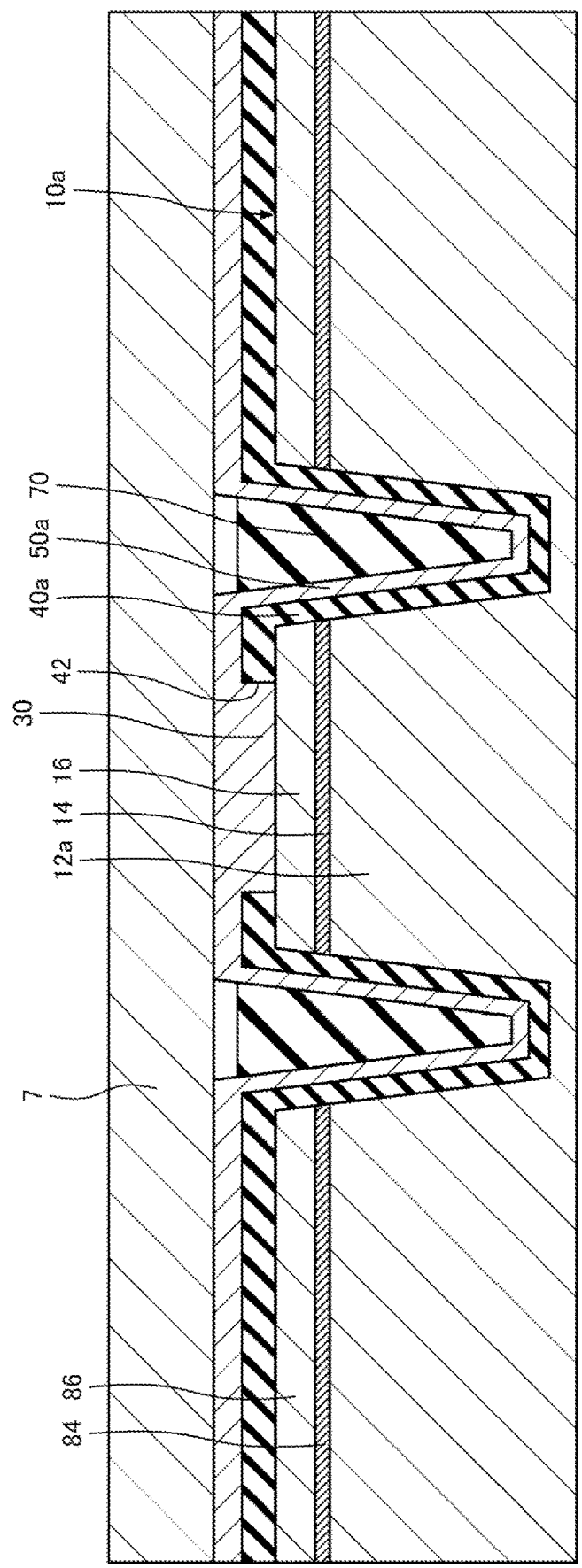
FIG. 10 is a cross-sectional view schematically illustrating a process of manufacturing the light-emitting device according to the first embodiment.

A second substrate 7 is attached at the metal layer 50a as illustrated in FIG. 10. Next, the first substrate 5 is removed. The removal of the first substrate 5 is performed, for example, through laser lift off. The second substrate 7 is, for example, a glass substrate. The second substrate 7 functions as a support substrate at the time of removing the first substrate 5.

Figure 11:
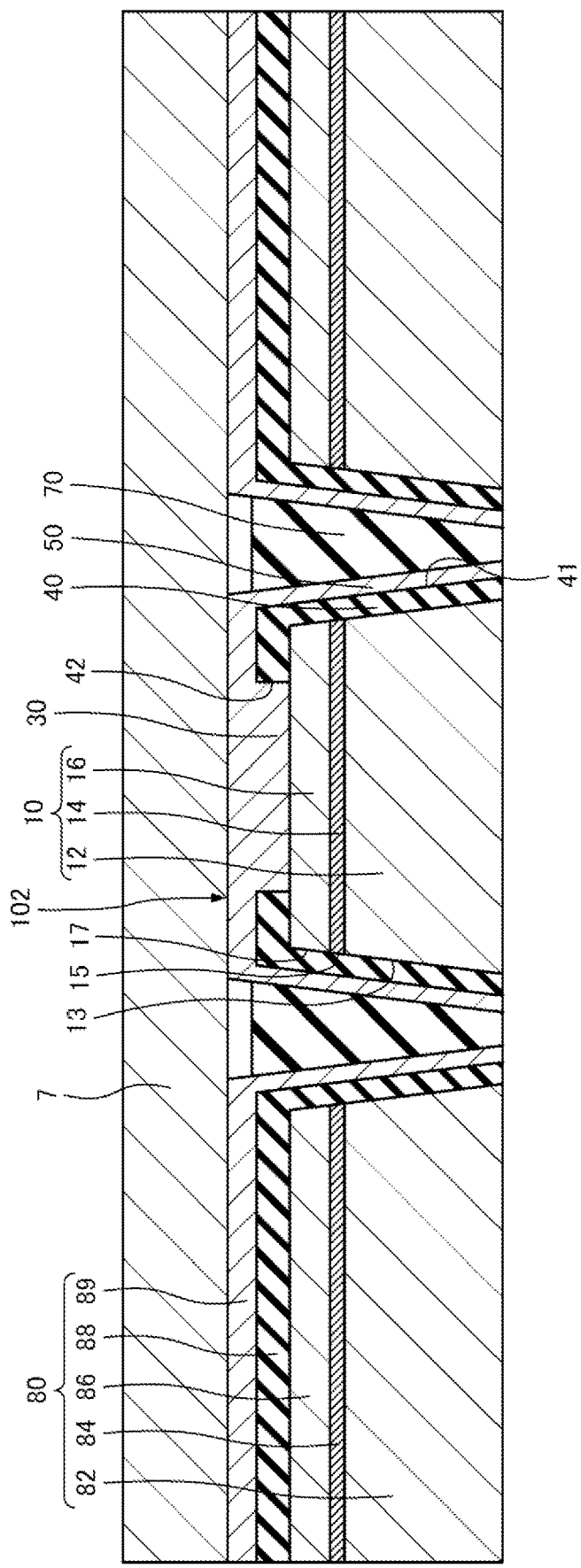
FIG. 11 is a cross-sectional view schematically illustrating a process of manufacturing the light-emitting device according to the first embodiment.

As illustrated in FIG. 11, a portion of the semiconductor layer 12a, a portion of the insulating layer 40a, a portion of the metal layer 50a, and a portion of the third insulating layer 70 are removed. The removal of the semiconductor layer 12a, the insulating layer 40a, the metal layer 50a, and the third insulating layer 70 are performed, for example, through CMP. This process makes it possible to form the first semiconductor layer 12 and the third semiconductor layer 82 made out of the semiconductor layer 12a. In addition, it is possible to form the first insulating layer 40 and the fourth insulating layer 88 made out of the insulating layer 40a. Furthermore, it is possible to form the metal layer 50 and the metal layer 89 made out of the metal layer 50a. In addition, it is possible to form the layered body 10 including the first semiconductor layer 12, the light-emitting layer 14, and the second semiconductor layer 16. The layered body 10 is comprised of the layered body 10a. In addition, it is possible to form the structural body 80 including the third semiconductor layer 82, the MQW layer 84, the fourth semiconductor layer 86, the fourth insulating layer 88, and the metal layer 89.

Figure 12:
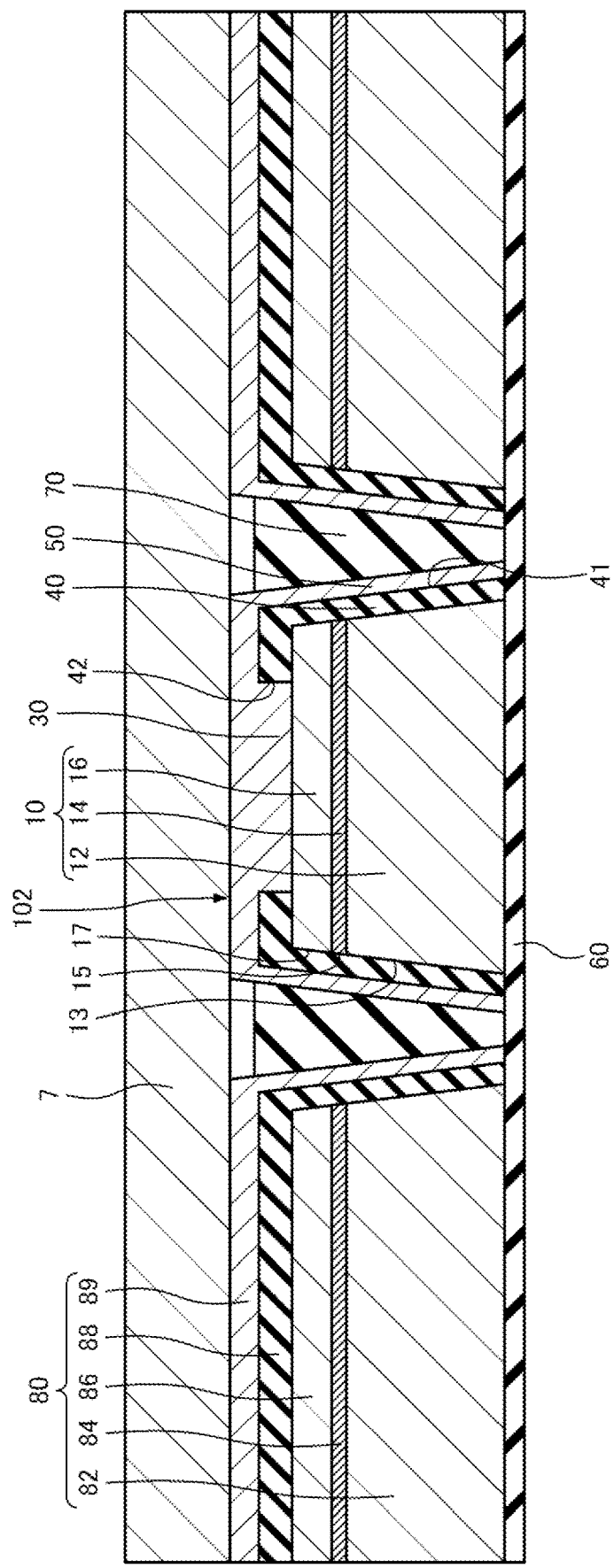
FIG. 12 is a cross-sectional view schematically illustrating a process of manufacturing the light-emitting device according to the first embodiment.

As illustrated in FIG. 12, the second insulating layer 60 is formed below the first semiconductor layer 12, below the third insulating layer 70, and below the third semiconductor layer 82. The second insulating layer 60 is formed, for example, through a CVD method or an ALD method.

Figure 13:
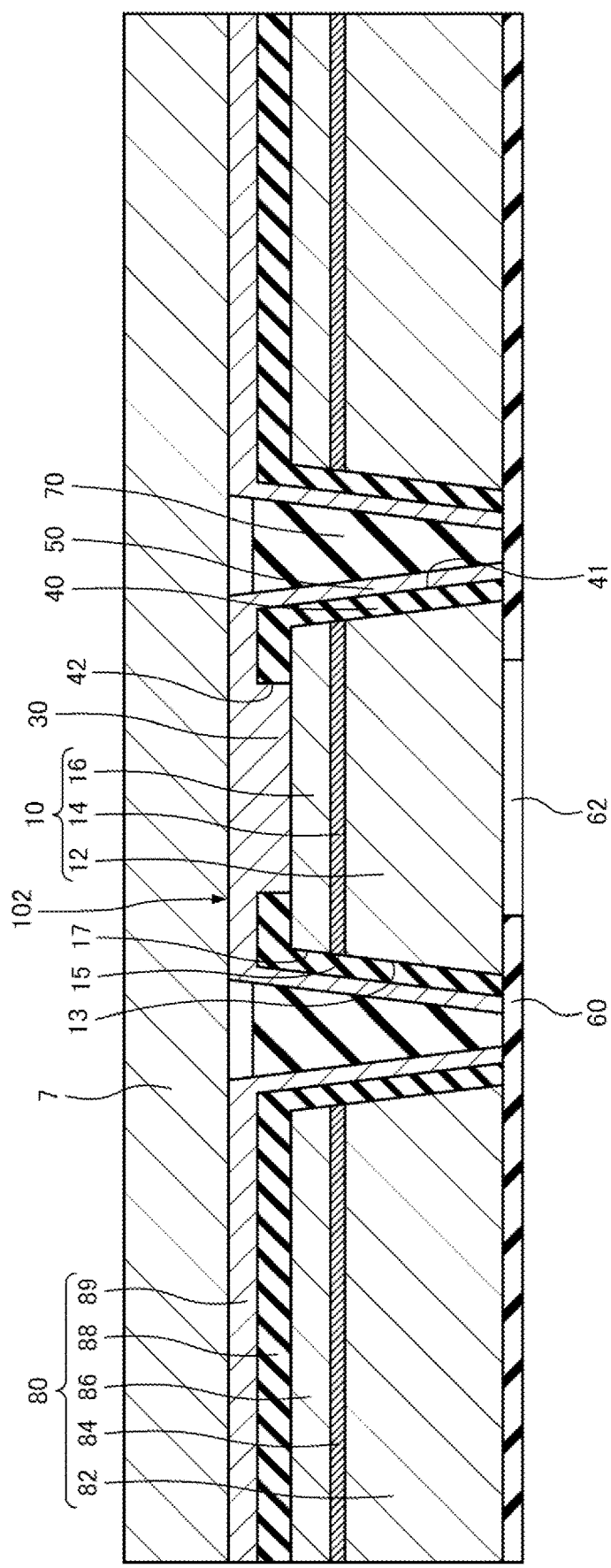
FIG. 13 is a cross-sectional view schematically illustrating a process of manufacturing the light-emitting device according to the first embodiment.

As illustrated in FIG. 13, the second insulating layer 60 is patterned to form the contact hole 62. This patterning is performed, for example, through photolithography and etching. With this process, the first semiconductor layer 12 is exposed.

Figure 14:
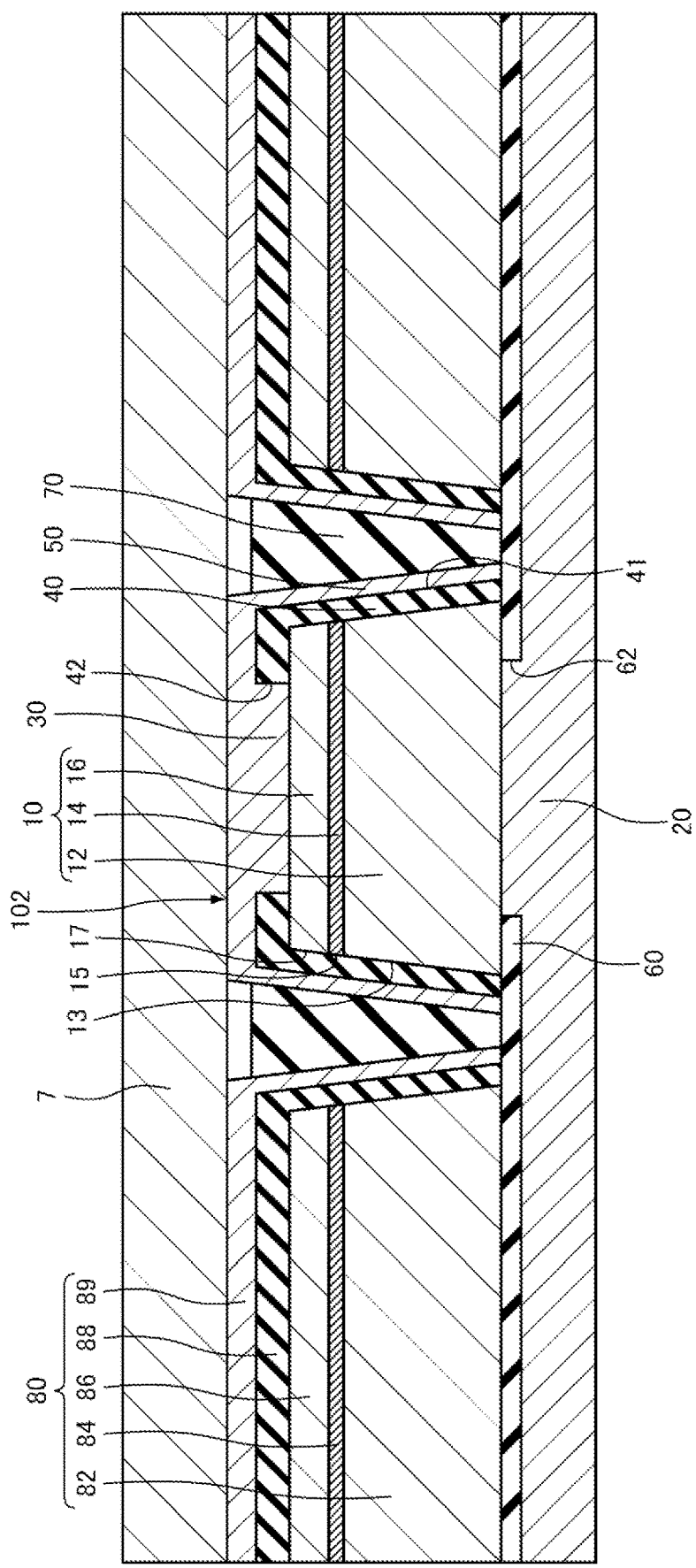
FIG. 14 is a cross-sectional view schematically illustrating a process of manufacturing the light-emitting device according to the first embodiment.

As illustrated in FIG. 14, the first electrode 20 is formed below the first semiconductor layer 12 and below the second insulating layer 60. The first electrode 20 is formed, for example, through vacuum deposition. This process makes it possible to form the light-emitting element 102.

Figure 15:
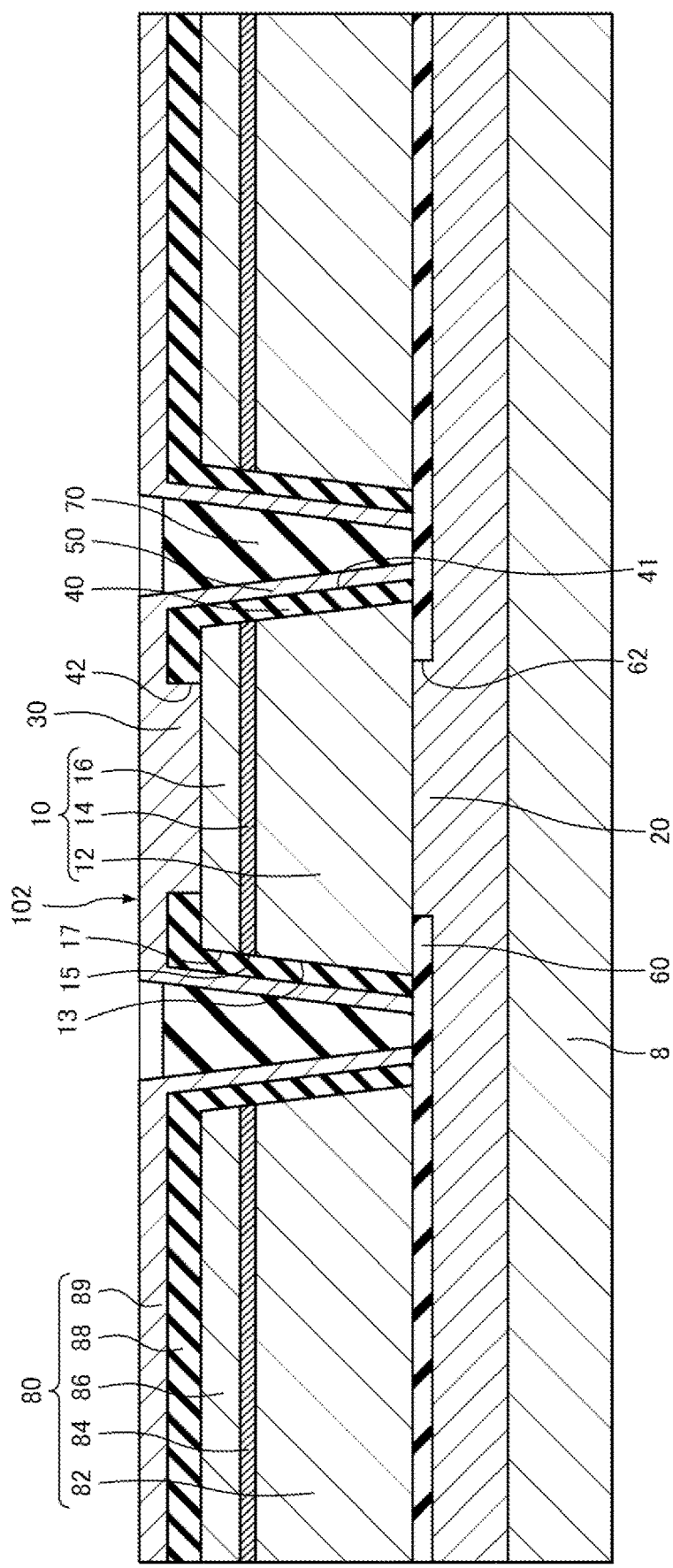
FIG. 15 is a cross-sectional view schematically illustrating a process of manufacturing the light-emitting device according to the first embodiment.

As illustrated in FIG. 15, a third substrate 8 is attached below the first electrode 20. Next, the second substrate 7 is detached from the metal layers 50 and 89. The third substrate 8 is, for example, a glass substrate. The third substrate 8 functions as a support substrate at the time of detaching the second substrate 7.

As illustrated in FIG. 1, the wiring substrate 90 is joined at the metal layer 50. Then, the third substrate 8 is detached from the first electrode 20.

Through the processes described above, it is possible to manufacture the light-emitting device 100.

1.3 Modification Example of Light-Emitting Device

1.3.1. First Modification Example

Figure 16:
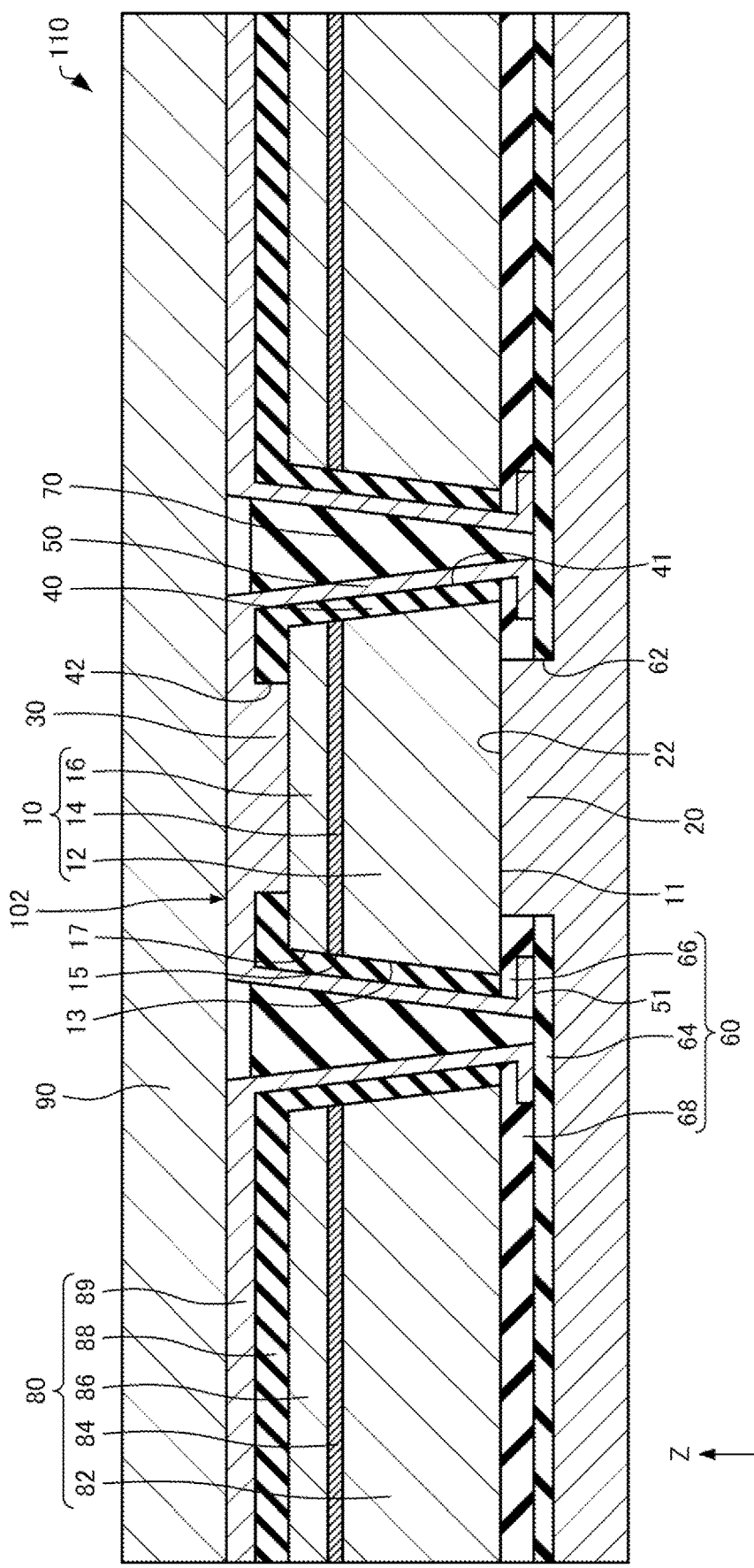
FIG. 16 is a cross-sectional view schematically illustrating a light-emitting device according to a first modification example of the first embodiment.

Next, a light-emitting device according to a first modification example of the first embodiment will be described with reference to the drawings. FIG. 16 is a cross-sectional view schematically illustrating a light-emitting device 110 according to the first modification example of the first embodiment.

Below, in connection with the light-emitting device 110 according to the first modification example of the first embodiment, the same reference characters are attached to members having functions similar to the component members of the light-emitting device 100 according to the first embodiment described above, and detailed explanation thereof will not be repeated. This similarly applies to a light-emitting device according to the second and third modification examples of the first embodiment described below.

In a case of the light-emitting device 100 described above, in the −Z-axis direction, the position of the first end 51 of the metal layer 50 is the same as the position of the second end 11 of the first semiconductor layer 12, as illustrated in FIG. 1.

In contrast, in a case of the light-emitting device 110, the position of the first end 51 of the metal layer 50 is on the −Z-axis direction side of the position of the second end 11 of the first semiconductor layer 12, as illustrated in FIG. 16.

The second insulating layer 60 includes, for example, a first layer 64 provided on the first electrode 20, a second layer 66 provided on the first layer 64, and a third layer 68 provided on the first layer 64. The second layer 66 is provided between the first layer 64 and the first semiconductor layer 12. The second layer 66 surround, for example, the contact surface 22 of the first electrode 20 as viewed from the −Z-axis direction. The material of the second layer 66 may be the same as that of the first layer 64 or may differ from the material of the first layer 64. The third layer 68 is provided between the first layer 64 and the third semiconductor layer 82. The material of the third layer 68 is, for example, the same as that of the second layer 66.

The metal layer 50 is provided between the first layer 64 and the second layer 66. The first end 51 of the metal layer 50 is in contact with the first layer 64. The metal layer 89 is provided between the first layer 64 and the third layer 68.

In the light-emitting device 110, the position of the first end 51 of the metal layer 50 is on the −Z-axis direction side of the position of the second end 11 of the first semiconductor layer 12. Thus, with the light-emitting device 110, it is possible to increase the number of times of reflection, at the metal layer 50, of light generated at the light-emitting layer 14, as compared, for example, with a case where the position of the first end is equal to the position of the second end in the −Z-axis direction.

1.3.2. Second Modification Example

Figure 17:
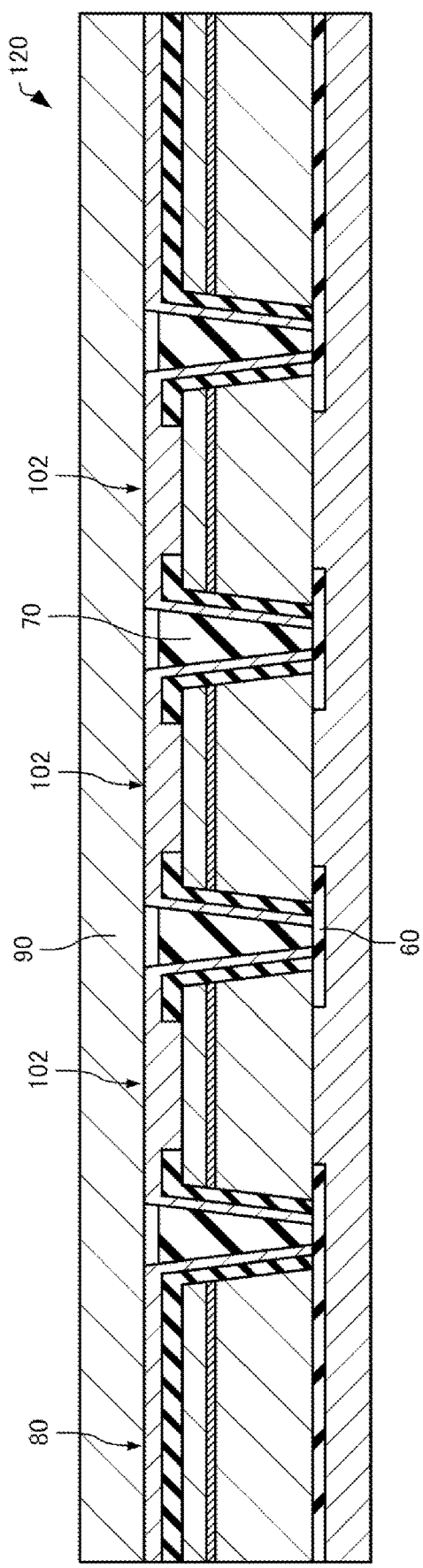
FIG. 17 is a cross-sectional view schematically illustrating a light-emitting device according to a second modification example of the first embodiment.

Next, a light-emitting device according to a second modification example of the first embodiment will be described with reference to the drawings. FIG. 17 is a cross-sectional view schematically illustrating a light-emitting device 120 according to the second modification example of the first embodiment.

In a case of the light-emitting device 100 described above, only one light-emitting element 102 is provided as illustrated in FIG. 1.

In contrast, in a case of the light-emitting device 120, a plurality of light-emitting elements 102 are provided as illustrated in FIG. 17. In the example illustrated in the drawing, three light-emitting elements 102 are provided. It is only necessary that the number of the light-emitting elements 102 is more than one, and there is no particular limitation as to the number of the light-emitting elements 102. In the example illustrated in the drawing, the first electrode 20 is an electrode common to the plurality of light-emitting elements 102. The plurality of light-emitting elements 102 may be arrayed in a matrix manner in the X-axis direction and the Y-axis direction. The light-emitting device 120 is configured such that the plurality of light-emitting elements 102 are individually turned on and off.

In the light-emitting device 120, the plurality of light-emitting elements 102 are provided. Thus, with the light-emitting device 120, it is possible to increase the output power, as compared, for example, with a case where only one light-emitting element is provided.

1.3.3. Third Modification Example

Figure 18:
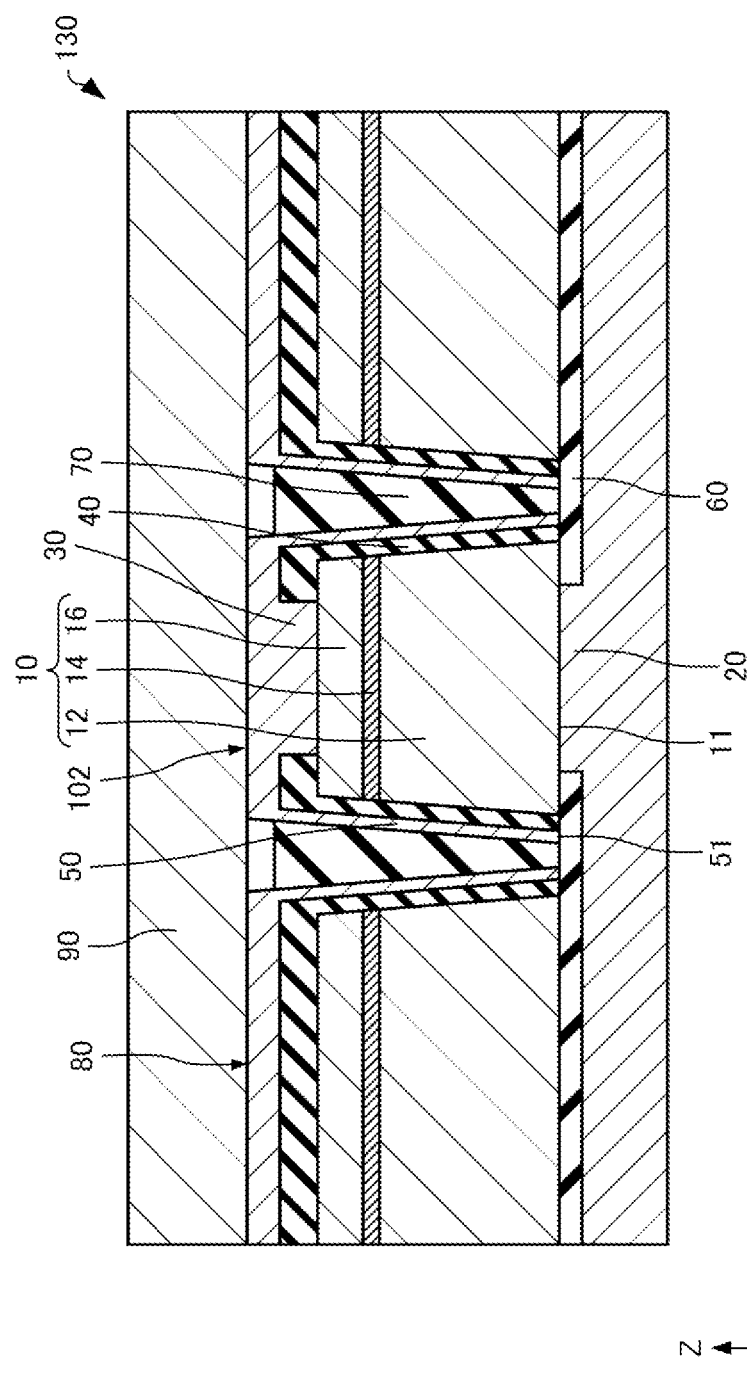
FIG. 18 is a cross-sectional view schematically illustrating a light-emitting device according to a third modification example of the first embodiment.

Next, a light-emitting device according to a third modification example of the first embodiment will be described with reference to the drawings. FIG. 18 is a cross-sectional view schematically illustrating a light-emitting device 130 according to the third modification example of the first embodiment.

In the light-emitting device 130, the diameter of the layered body 10 is smaller than the diameter of the light-emitting device 100 described above, as illustrated in FIG. 18.

In the light-emitting device 130, the ratio of the diameter of the layered body 10 relative to the size of the layered body 10 in the layered direction is smaller than that of the light-emitting device 100. This ratio is, for example, not less than 0.2 and not more than 0.5. By setting this ratio to not more than 0.5, it is possible to arrange the light-emitting elements 102 in a highly dense manner when a plurality of light-emitting elements 102 are provided as illustrated in FIG. 17.

In the light-emitting device 130, the number of times of reflection, at the metal layer 50, of light generated at the light-emitting layer 14 increases, as compared, for example, with the light-emitting device 100. Thus, in a case of the light-emitting device 130, in particular, in the −Z-axis direction, it is desired that the position of the first end 51 is the same as the position of the second end 11, or the first end 51 is located further in the −Z-axis direction than the second end 11.

2. Second Embodiment

2.1. Light-Emitting Device

Figure 19:
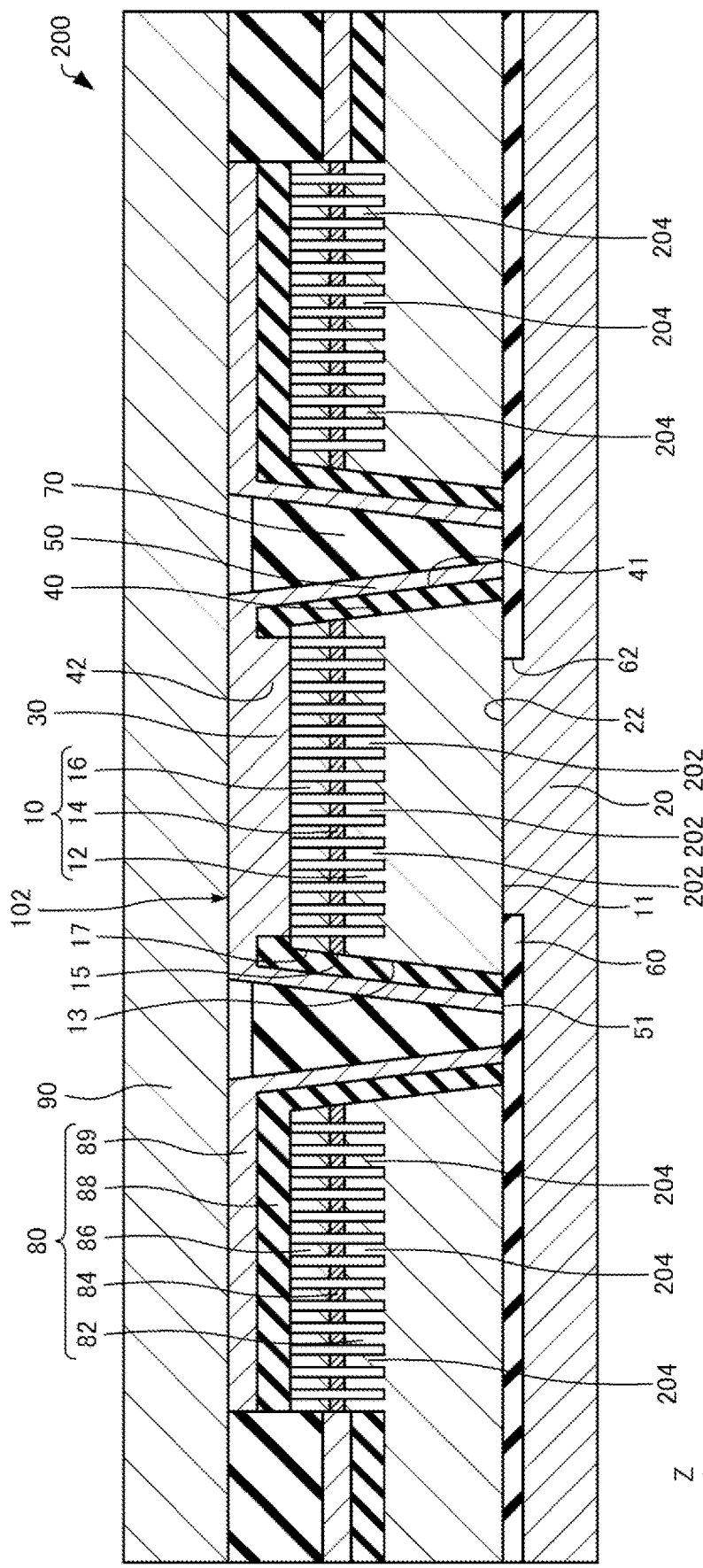
FIG. 19 is a cross-sectional view schematically illustrating a light-emitting device according to a second embodiment.

Next, a light-emitting device according to a second embodiment will be described with reference to the drawings. FIG. 19 is a cross-sectional view schematically illustrating a light-emitting device 200 according to the second embodiment.

Below, in the light-emitting device 200 according to the second embodiment, the same reference characters are attached to members having functions similar to component members of the light-emitting device 100 according to the first embodiment described above, and detailed explanation thereof will not be repeated.

In the light-emitting device 200, the layered body 10 differs from the light-emitting device 100 described above in that a plurality of column portions 202 are provided, as illustrated in FIG. 19.

The column portion 202 is called, for example, a nano-column, a nano-wire, a nano-rod, or a nano-pillar. The planar shape of the column portion 202 is, for example, a polygonal shape such as a regular hexagon, or a circular shape. The diameter of the column portion 202 is, for example, not less than 50 nm and not more than 500 nm. By setting the diameter of the column portion 202 to not more than 500 nm, it is possible to obtain the light-emitting layer 14 with high-quality crystal, and it is also possible to reduce strain existing in the light-emitting layer 14. This makes it possible to highly efficiently amplify light generated at the light-emitting layer 14.

The plurality of column portions 202 are separated from each other. In the example illustrated in the drawing, a space exists between adjacent column portions 202. Note that, although illustration is not given, a light transmission layer configured to transmit, in the in-plane direction, light generated at the light-emitting layer 14 may be provided between adjacent column portions 202. The distance between adjacent column portions 202 is, for example, not less than 1 nm and not more than 500 nm. The plurality of column portions 202 are arrayed at a predetermined pitch in a predetermined direction as viewed from the −Z-axis direction. The plurality of column portions 202 are arrayed, for example, in a regular-triangle lattice form or a square lattice form. The plurality of column portions 202 make it possible to achieve an effect of photonic crystal.

Note that the expression "pitch of column portions 202" represents a distance between centers of column portions 202 adjacent in a predetermined direction. The expression "center of a column portion 202" represents the center of a circle when the planar shape of the column portion 202 is the circle, and represents the center of a minimum bounding circle when the planar shape of the column portion 202 is not a circle. For example, when the planar shape of the column portion 202 is a polygonal shape, the center of the column portion 202 is the center of a minimum circle including this polygonal shape. When the planar shape of the column portion 202 is an ellipse shape, the center of the column portion 202 is the center of a minimum circle including this ellipse shape.

The light-emitting layer 14 and the second semiconductor layer 16 constitute the plurality of column portions 202. In the example illustrated in the drawing, the first semiconductor layer 12, the light-emitting layer 14, and the second semiconductor layer 16 constitute the plurality of column portions 202. The third semiconductor layer 82, the MQW layer 84, and the fourth semiconductor layer 86 constitute, for example, a plurality of column portions 204.

In the light-emitting device 200, light generated at the light-emitting layer 14 is transmitted in an in-plane direction, and forms standing wave due to the effect of photonic crystal of the plurality of column portions 202. Then, the light gets a gain at the light-emitting layer 14, and laser oscillation is performed. After this, the light-emitting device 200 outputs laser light. The light-emitting device 200 is a semiconductor laser.

In the light-emitting device 200, the layered body 10 includes the plurality of column portions 202. The light-emitting layer 14 and the second semiconductor layer 16 constitute the plurality of column portions 202. Thus, in the light-emitting device 200, it is possible to output laser light.

2.2. Method of Manufacturing Light-Emitting Device

Next, a method of manufacturing the light-emitting device 200 according to the second embodiment will be described.

In the method of manufacturing the light-emitting device 200, the column portions 202 and 204 are formed through epitaxial growth using, as a mask, a mask layer that is not illustrated in the drawing. Examples of the method for the epitaxial growth includes an MOCVD and an MBE method.

As for the matters other than those described above, the method of manufacturing the light-emitting device 200 is basically the same as the method of manufacturing the light-emitting device 100 described above. Thus, detailed explanation thereof will not be repeated.

2.3. Modification Example of Light-Emitting Device

Figure 20:
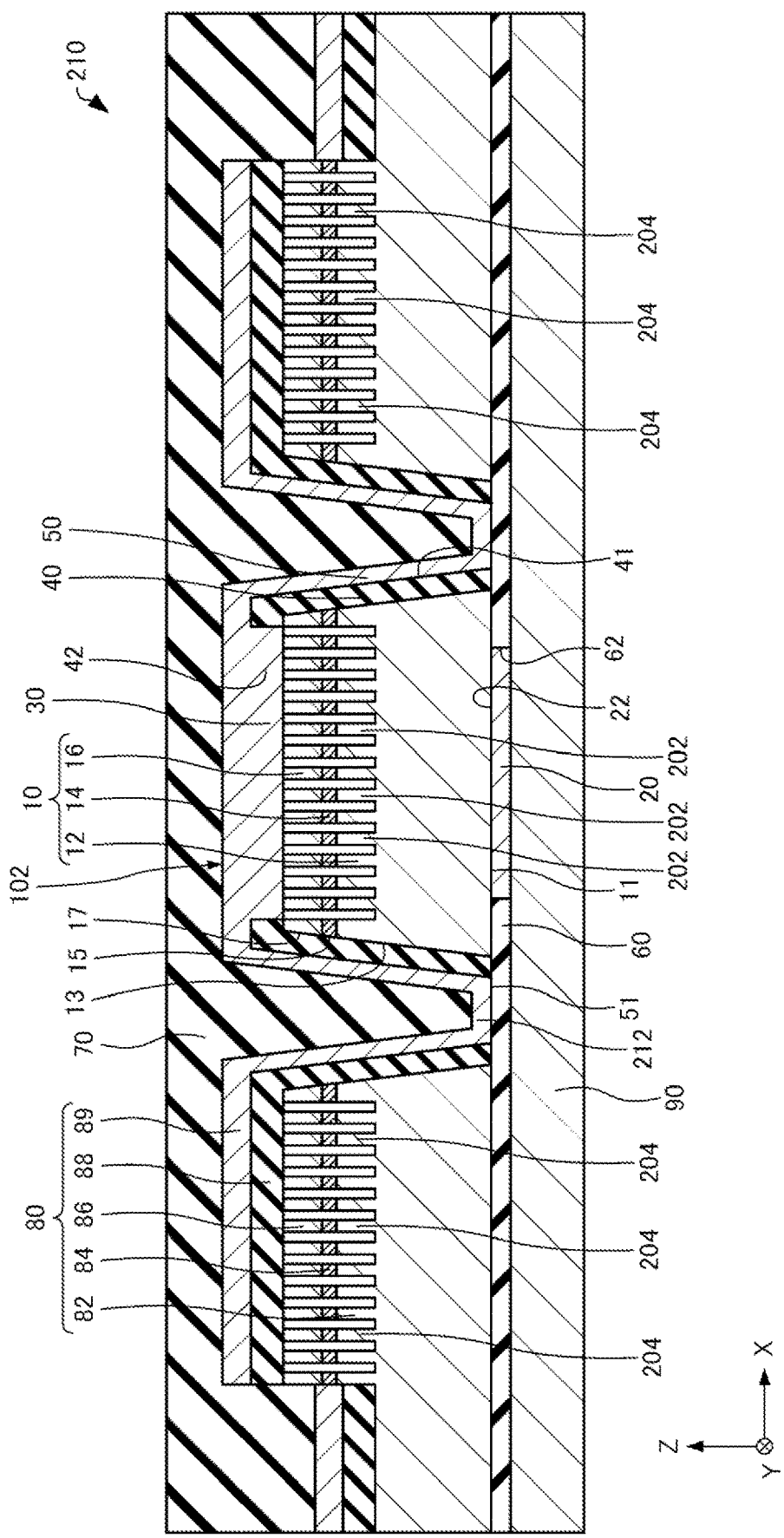
FIG. 20 is a cross-sectional view schematically illustrating a light-emitting device according to a modification example of the second embodiment.

Next, a light-emitting device 210 according to a modification example of the second embodiment will be described with reference to the drawings. FIG. 20 is a cross-sectional view schematically illustrating the light-emitting device 210 according to the modification example of the second embodiment.

Below, in the light-emitting device 210 according to the modification example of the second embodiment, the same reference characters are attached to members having functions similar to component members of the light-emitting device 200 according to the second embodiment described above, and detailed explanation thereof will not be repeated.

In the light-emitting device 200 described above, the wiring substrate 90 is joined to the second electrode 30 as illustrated in FIG. 19.

In contrast, in the light-emitting device 210, the wiring substrate 90 is joined to the first electrode 20 as illustrated in FIG. 20. The wiring substrate 90 is configured so as to allow light generated at the light-emitting layer 14 to pass through. The metal layer 50 and the metal layer 89 are coupled with the metal layer 212. The material of the metal layer 212 is, for example, the same as that of the metal layer 50. The metal layers 50, 89, and 212 are integrally provided. The metal layer 212 is formed in the same process as that for the metal layer 50. The third insulating layer 70 is provided on the second electrode 30 and on the metal layer 89.

In the light-emitting device 210, the wiring substrate 90 is joined to the first electrode 20, and the wiring substrate 90 is configured so as to allow light generated at the light-emitting layer 14 to pass through. Thus, with the light-emitting device 210, it is possible to allow light generated at the light-emitting layer 14 to pass through the wiring substrate 90, and output the light.

3. Third Embodiment

3.1. Light-Emitting Device

Figure 21:
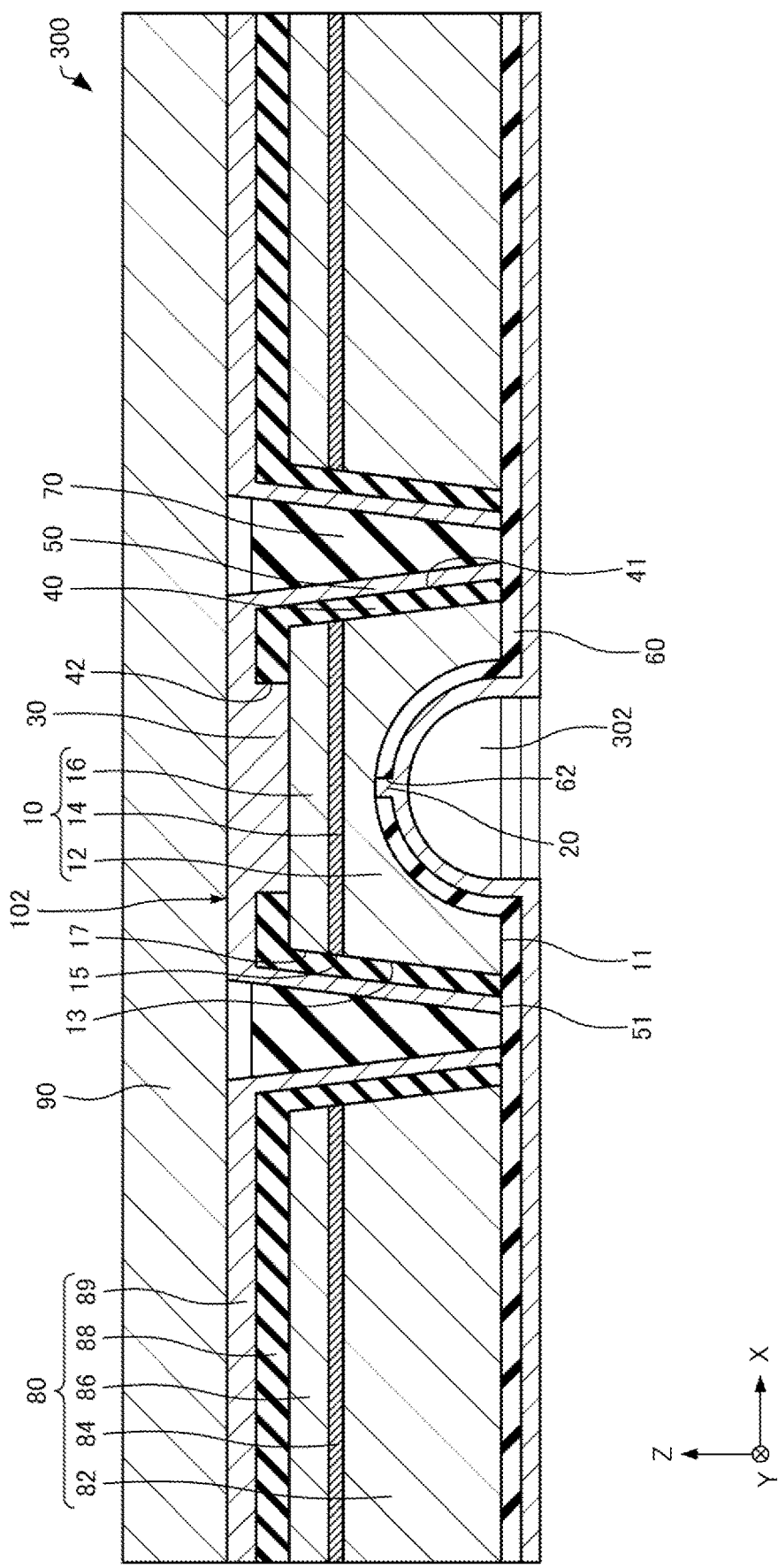
FIG. 21 is a cross-sectional view schematically illustrating a light-emitting device according to a third embodiment.

Next, a light-emitting device according to the third embodiment will be described with reference to the drawings. FIG. 21 is a cross-sectional view schematically illustrating a light-emitting device 300 according to the third embodiment.

Below, in the light-emitting device 300 according to the third embodiment, the same reference characters are attached to members having functions similar to component members of the light-emitting device 100 according to the first embodiment, and detailed explanation thereof will not be repeated.

The light-emitting device 300 differs from the light-emitting device 100 described above in that an opening portion 302 is provided in the first semiconductor layer 12, as illustrated in FIG. 21.

The opening portion 302 is defined by the first semiconductor layer 12. The opening portion 302 does not reach the light-emitting layer 14. In the example illustrated in the drawing, the shape of the first semiconductor layer 12 that defines the opening portion 302 is an arc shape, and specifically, is a semicircular shape. The depth of the opening portion 302 is, for example, larger than half the size of the first semiconductor layer 12 in the layered direction. The inside of the opening portion 302 is, for example, hollow. The width of the opening portion 302 is larger than the width of the contact hole 62.

In the light-emitting device 300, the opening portion 302 is provided in the first semiconductor layer 12, and the inside of the opening portion 302 is hollow. Thus, with the light-emitting device 300, it is possible to reduce light generated at the light-emitting layer 14 and absorbed by the first semiconductor layer 12, as compared with a case where no opening portion is provided in the first semiconductor layer. In particular, when the light generated at the light-emitting layer 14 is ultraviolet light, the light is more likely to be absorbed at the first semiconductor layer 12, and thus, it is desirable to provide the opening portion 302.

3.2. Method of Manufacturing Light-Emitting Device

Next, a method of manufacturing the light-emitting device 300 according to the third embodiment will be described with reference to the drawings. FIGS. 22 to 26 are cross-sectional views each schematically illustrating a process of manufacturing the light-emitting device 300 according to the third embodiment.

The method of manufacturing the light-emitting device 300 is basically the same as the method of manufacturing the light-emitting device 100 until a step for forming the layered body 10 including the first semiconductor layer 12, the light-emitting layer 14, and the second semiconductor layer 16, and also forming the structural body 80 including the third semiconductor layer 82, the MQW layer 84, the fourth semiconductor layer 86, the fourth insulating layer 88, and the metal layer 89, as illustrated in FIG. 11.

Figure 22:
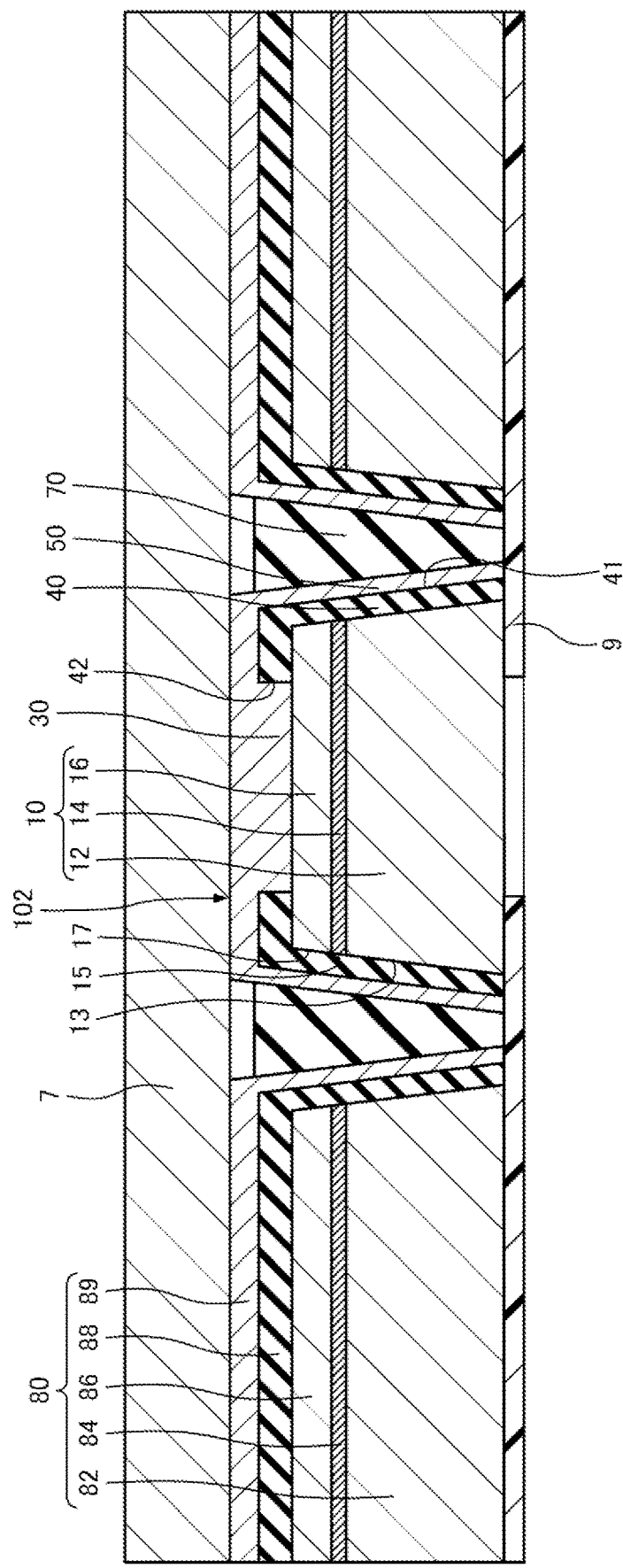
FIG. 22 is a cross-sectional view schematically illustrating a process of manufacturing the light-emitting device according to the third embodiment.

In the method of manufacturing the light-emitting device 300, the layered body 10 and the structural body 80 are formed, and then, a resist layer 9 having a predetermined shape is formed below the first semiconductor layer 12, below the third insulating layer 70, and below the third semiconductor layer 82, as illustrated in FIG. 22. The resist layer 9 is applies, for example, through a spin coating method and is patterned through photolithography.

Figure 23:
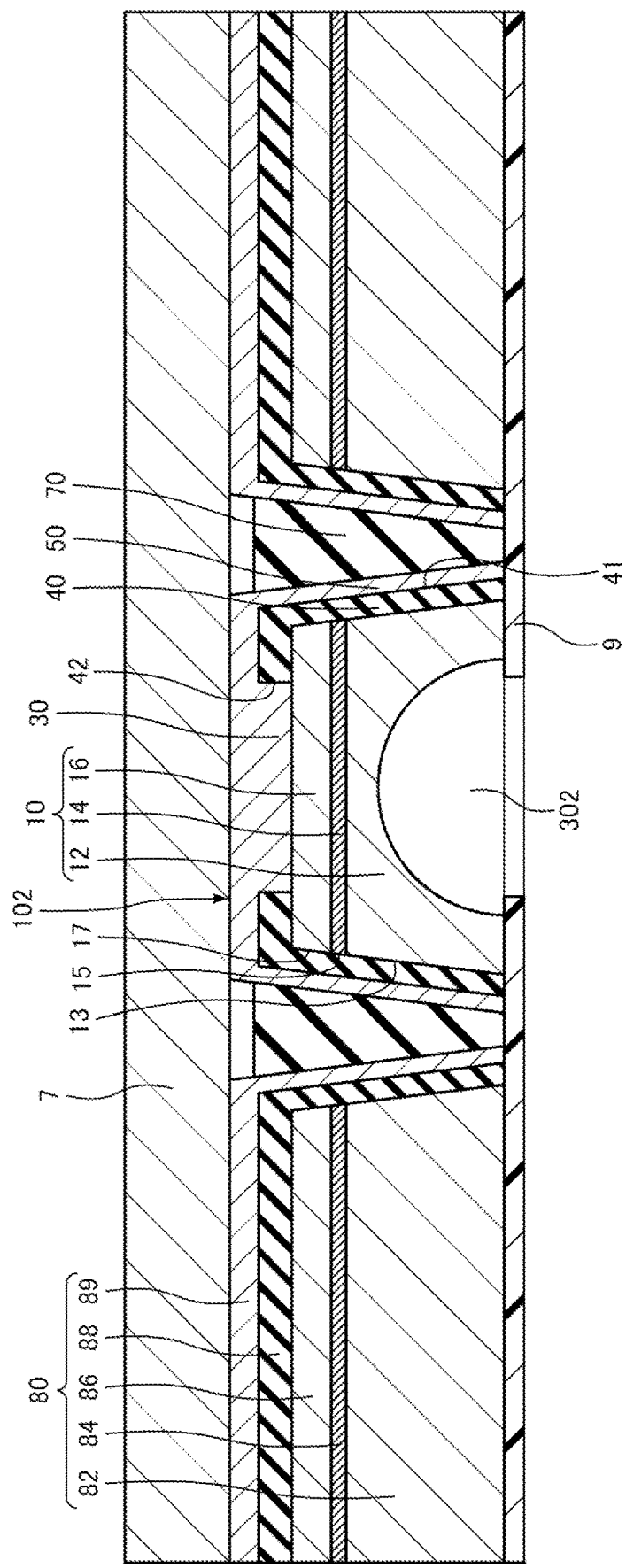
FIG. 23 is a cross-sectional view schematically illustrating a process of manufacturing the light-emitting device according to the third embodiment.

By using the resist layer 9 as a mask, the first semiconductor layer 12 is etched to form the opening portion 302, as illustrated in FIG. 23. The etching is performed, for example, through wet etching. The first semiconductor layer 12 is isotropically etched through wet etching.

Figure 24:
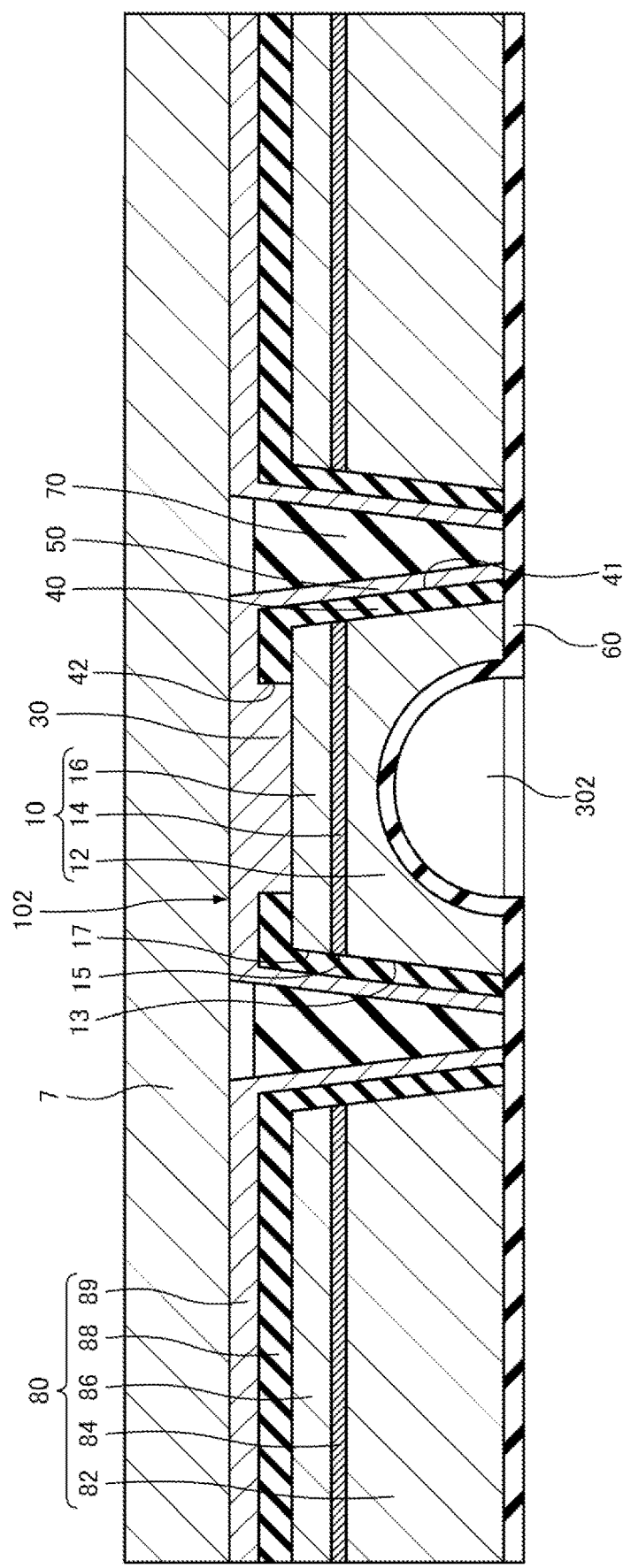
FIG. 24 is a cross-sectional view schematically illustrating a process of manufacturing the light-emitting device according to the third embodiment.

As illustrated in FIG. 24, after the resist layer 9 is peeled, the second insulating layer 60 is formed below the first semiconductor layer 12, below the third insulating layer 70, and below the third semiconductor layer 82. The method of forming the second insulating layer 60 is performed in the manner described above.

Figure 25:
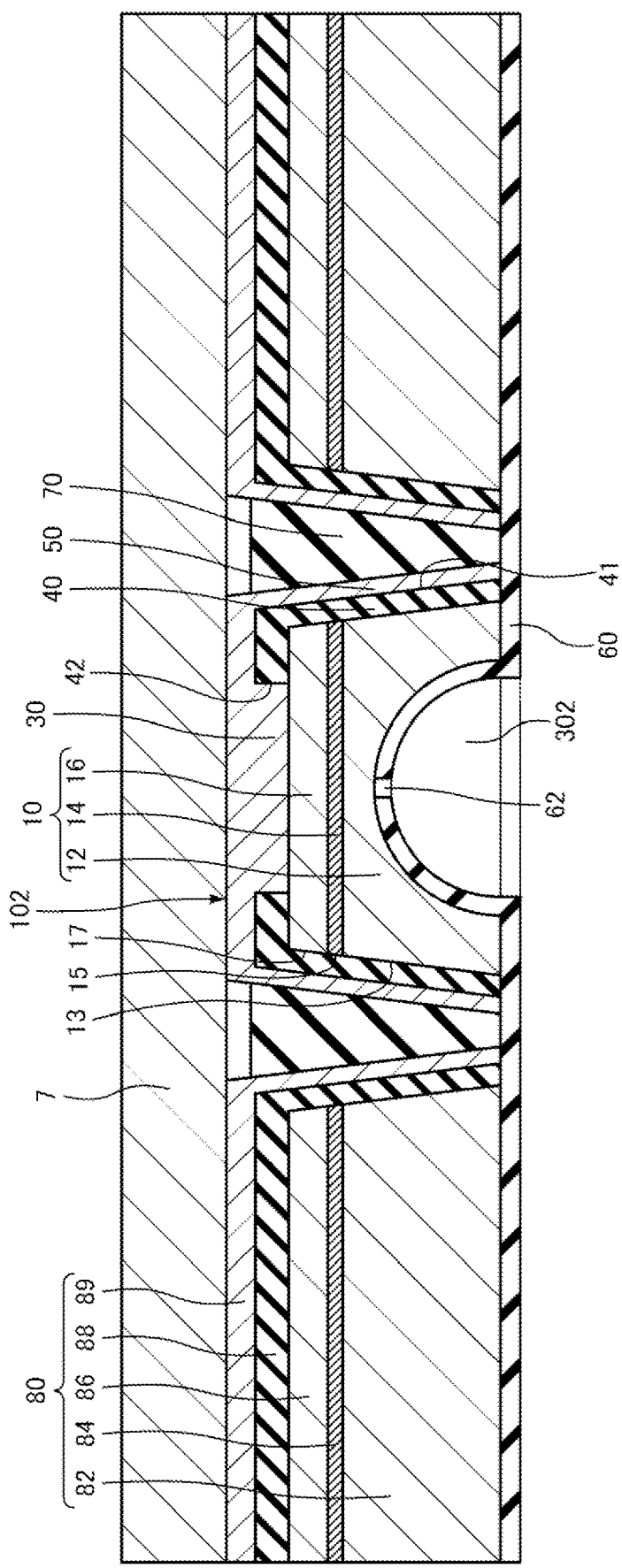
FIG. 25 is a cross-sectional view schematically illustrating a process of manufacturing the light-emitting device according to the third embodiment.

As illustrated in FIG. 25, the second insulating layer 60 is patterned to form the contact hole 62. The method of patterning is performed in the manner described above.

Figure 26:
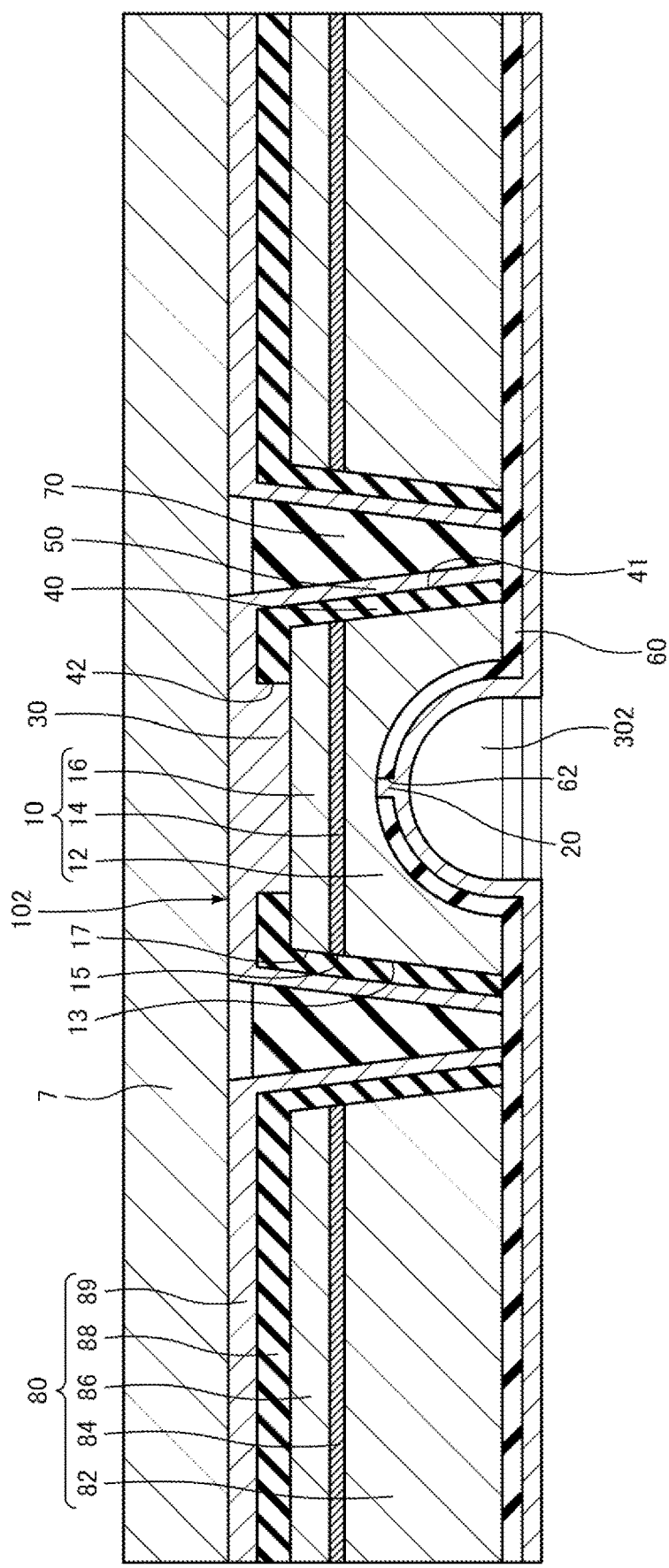
FIG. 26 is a cross-sectional view schematically illustrating a process of manufacturing the light-emitting device according to the third embodiment.

As illustrated in FIG. 26, the first electrode 20 is formed below the first semiconductor layer 12 and below the second insulating layer 60. The method of forming the first electrode 20 is performed in the manner described above.

As illustrated in FIG. 21, after a substrate is attached to the first electrode 20, the second substrate 7 is removed, and the wiring substrate 90 is joined at the second electrode 30. Then, the substrate attached to the first electrode 20 is removed.

Through the processes described above, it is possible to manufacture the light-emitting device 300.

4. Fourth Embodiment

Figure 27:
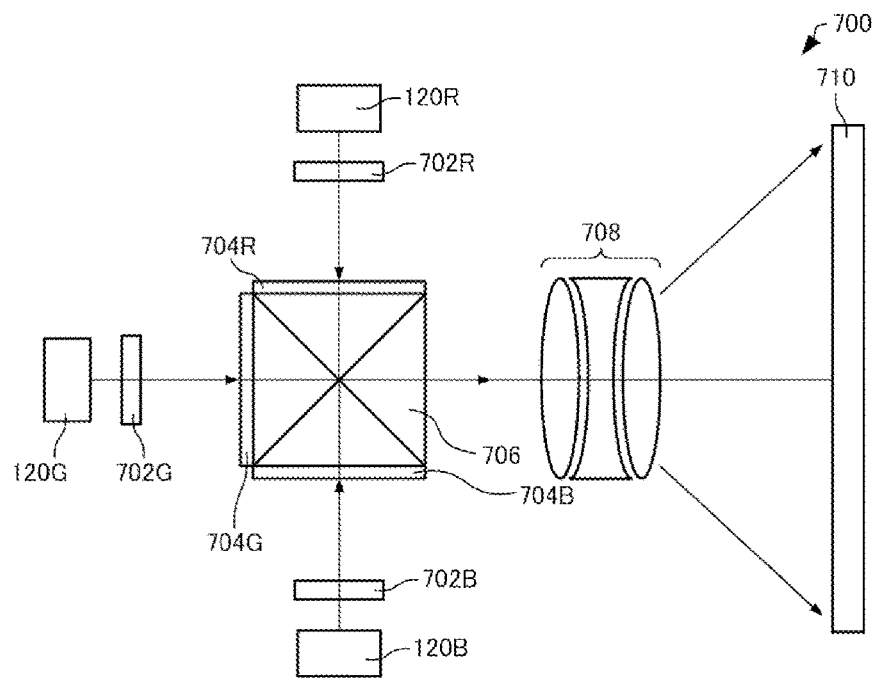
FIG. 27 is diagram schematically illustrating a projector according to a fourth embodiment.

Next, a projector according to a fourth embodiment will be described with reference to the drawings. FIG. 27 is a diagram schematically illustrating a projector 700 according to the fourth embodiment.

The projector 700 includes, for example, a light-emitting device 120 serving as a light source.

The projector 700 includes a housing that is not illustrated in the drawing, and also includes a red light source 120R, a green light source 120G, and a blue light source 120B provided within the housing and configured to output red light, green light, and blue light, respectively. Note that, for the purpose of convenience, FIG. 27 illustrates the red light source 120R, the green light source 120G, and the blue light source 120B in a simplified manner.

The projector 700 further includes, within the housing, a first optical element 702R, a second optical element 702G, a third optical element 702B, a first optical modulation device 704R, a second optical modulation device 704G, a third optical modulation device 704B, and a projection device 708. The first optical modulation device 704R, the second optical modulation device 704G, and the third optical modulation device 704B are, for example, transmissive-type liquid crystal light valves. The projection device 708 is, for example, a projection lens.

Light outputted from the red light source 120R enters the first optical element 702R. The light outputted from the red light source 120R is collected and condensed by the first optical element 702R. Note that the first optical element 702R may have functions other than collecting and condensing light. This similarly applies to the second optical element 702G and the third optical element 702B that will be described later.

The light collected and condensed by the first optical element 702R enters the first optical modulation device 704R. The first optical modulation device 704R modulates the entered light in accordance with image information. Then, the projection device 708 enlarges an image formed by the first optical modulation device 704R, and projects it on a screen 710.

The light outputted from the green light source 120G enters the second optical element 702G. The light outputted from the green light source 120G is collected and condensed by the second optical element 702G.

The light collected and condensed by the second optical element 702G enters the second optical modulation device 704G. The second optical modulation device 704G modulates the entered light in accordance with image information. Then, the projection device 708 enlarges an image formed by the second optical modulation device 704G, and projects it on the screen 710.

The light outputted from the blue light source 120B enters the third optical element 702B. The light outputted from the blue light source 120B is collected and condensed by the third optical element 702B.

The light collected and condensed by the third optical element 702B enters the third optical modulation device 704B. The third optical modulation device 704B modulates the entered light in accordance with image information. Then, the projection device 708 enlarges an image formed by the third optical modulation device 704B, and projects it on the screen 710.

The projector 700 further includes a cross dichroic prism 706 configured to combine light outputted from the first optical modulation device 704R, the second optical modulation device 704G, and the third optical modulation device 704B, and guide it to the projection device 708.

Three types of colored light modulated by the first optical modulation device 704R, the second optical modulation device 704G, and the third optical modulation device 704B enter the cross dichroic prism 706. The cross dichroic prism 706 is formed by attaching four rectangular prisms together, and is configured such that a dielectric multilayer film configured to reflect red light and a dielectric multilayer film configured to reflect blue light are arranged at inner surfaces thereof. With these dielectric multilayer films, three types of color light are combined to form light representing a color image. Then, the combined light is projected on the screen 710 by the projection device 708, and an enlarged image is displayed.

Note that the red light source 120R, the green light source 120G, and the blue light source 120B may be configured to directly form an image without using the first optical modulation device 704R, the second optical modulation device 704G, and the third optical modulation device 704B, by controlling the light-emitting device 100 as a pixel of an image in accordance with image information. Then, the projection device 708 may enlarge an image formed by the red light source 120R, the green light source 120G, and the blue light source 120B to project it on the screen 710.

In addition, in the example described above, a transmissive-type liquid crystal light valve is used as an optical modulation device. However, a light valve other than liquid crystal may be used, or a reflective-type light valve may be used. Such a light valve includes, for example, a reflective-type liquid crystal light valve or a digital micromirror device. In addition, the configuration of the projection device varies depending on a type of a light valve used, on an as-necessary basis.

Furthermore, the light source can be applied to a light source device of a scanning-type image display device including a scanning unit, which is an image forming device configured to scan light from the light source on a screen to cause an image having a desired size to be displayed on a display surface.

5. Fifth Embodiment

Figure 28:
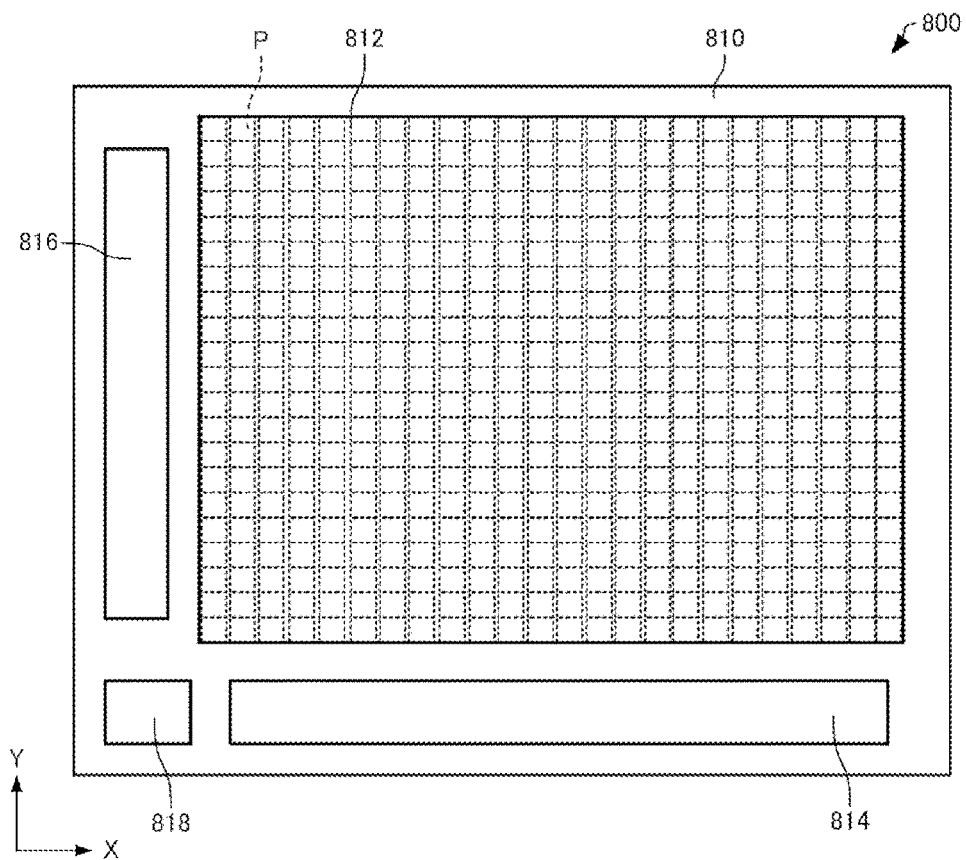
FIG. 28 is a plan view schematically illustrating a display according to a fifth embodiment.
Figure 29:
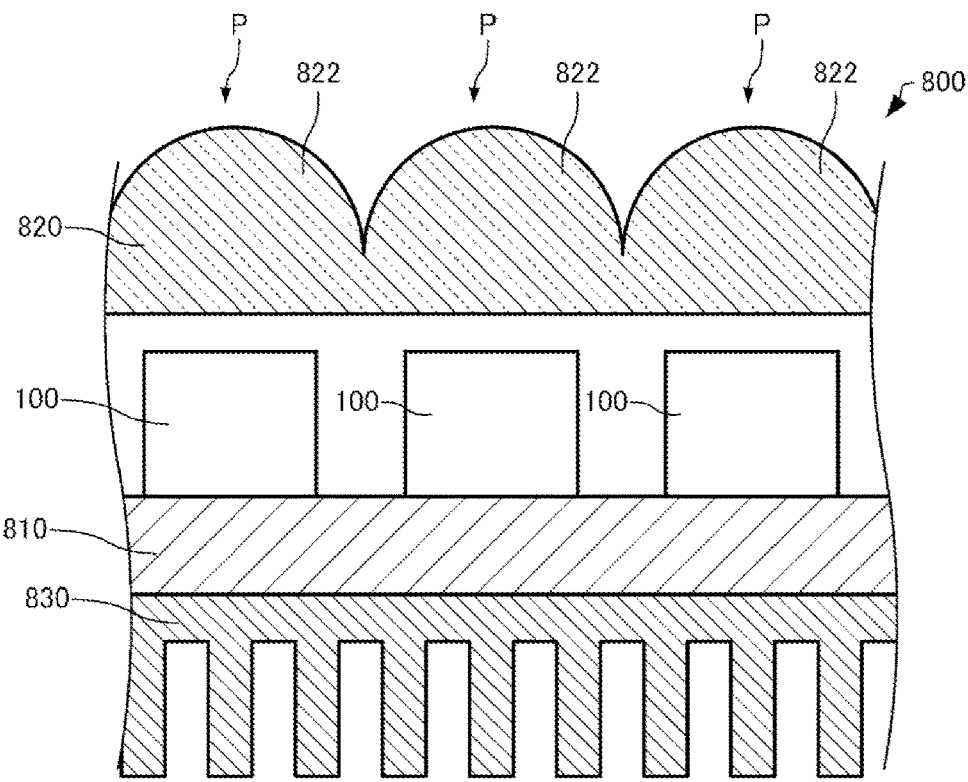
FIG. 29 is a cross-sectional view schematically illustrating the display according to the fifth embodiment.

Next, a display according to a fifth embodiment will be described with reference to the drawings. FIG. 28 is a plan view schematically illustrating a display 800 according to the fifth embodiment. FIG. 29 is a cross-sectional view schematically illustrating the display 800 according to the fifth embodiment. Note that, in FIG. 28, the X-axis and the Y-axis are illustrated as two axes perpendicular to each other.

The display 800 includes, for example, the light-emitting device 100 serving as a light source. Note that, for the purpose of convenience, FIGS. 28 and 29 illustrate the light-emitting device 100 in a simplified manner.

The display 800 is a display device configured to display an image. The image includes an image in which only character information is displayed. The display 800 is a self-light emission type display. The display 800 includes, for example, a printed wired board 810, a lens array 820, and a heat sink 830, as illustrated in FIGS. 28 and 29.

The printed wired board 810 is comprised, for example, of the wiring substrate 90 of the light-emitting device 100. A driving circuit used to drive the light-emitting device 100 is mounted at the printed wired board 810. The driving circuit is, for example, a circuit including a CMOS. The driving circuit is configured, for example, to drive the light-emitting device 100 based on inputted image information. Although illustration is not given, a light-transmitting substrate used to protect the printed wired board 810 is arranged on the printed wired board 810.

The printed wired board 810 includes, for example, a display region 812, a data line driving circuit 814, a scanning line drive circuit 816, and a control circuit 818.

The display region 812 includes a plurality of pixels P. In the example illustrated in the drawing, the pixels P are arrayed along the X-axis and the Y-axis.

Although illustration is not given, the printed wired board 810 includes a plurality of scanning lines and a plurality of data lines. For example, the scanning lines extend along the X-axis, and the data lines extend along the Y-axis. The scanning lines are coupled to the scanning line drive circuit 816. The data lines are coupled to the data line driving circuit 814. Pixels P are each provided so as to correspond an intersection of the scanning line and the data line.

One pixel P includes, for example, one light-emitting device 100, one lens 822, and a pixel circuit that is not illustrated in the drawing. The pixel circuit includes a switching transistor configured to function as a switch of the pixel P. A gate of the switching transistor is coupled to the scanning line, and a source or one-side drain is coupled to the data line.

The data line driving circuit 814 and the scanning line drive circuit 816 are circuits configured to control driving of the light-emitting device 100 that constitutes the pixel P. The control circuit 818 controls display of an image.

Image data is supplied from an upper circuit to the control circuit 818. The control circuit 818 supplies various types of signals based on this image data to the data line driving circuit 814 and the scanning line drive circuit 816.

As the scanning line drive circuit 816 makes a scanning signal active to select a scanning line, the switching transistor of the selected pixel P is turned on. At this time, as the data line driving circuit 814 supplies a data signal from a data line to the selected pixel P, the light-emitting device 100 of the selected pixel P emits light in accordance with the data signal.

The lens array 820 includes a plurality of lenses 822. One lens 822 is provided, for example, to one light-emitting device 100. Light outputted from the light-emitting device 100 enters one lens 822.

The heat sink 830 is in contact with the printed wired board 810. The material of the heat sink 830 is, for example, a metal such as copper or aluminum. The heat sink 830 dissipates heat generated at the light-emitting device 100.

6. Sixth Embodiment

6.1. Overall Configuration

Figure 30:
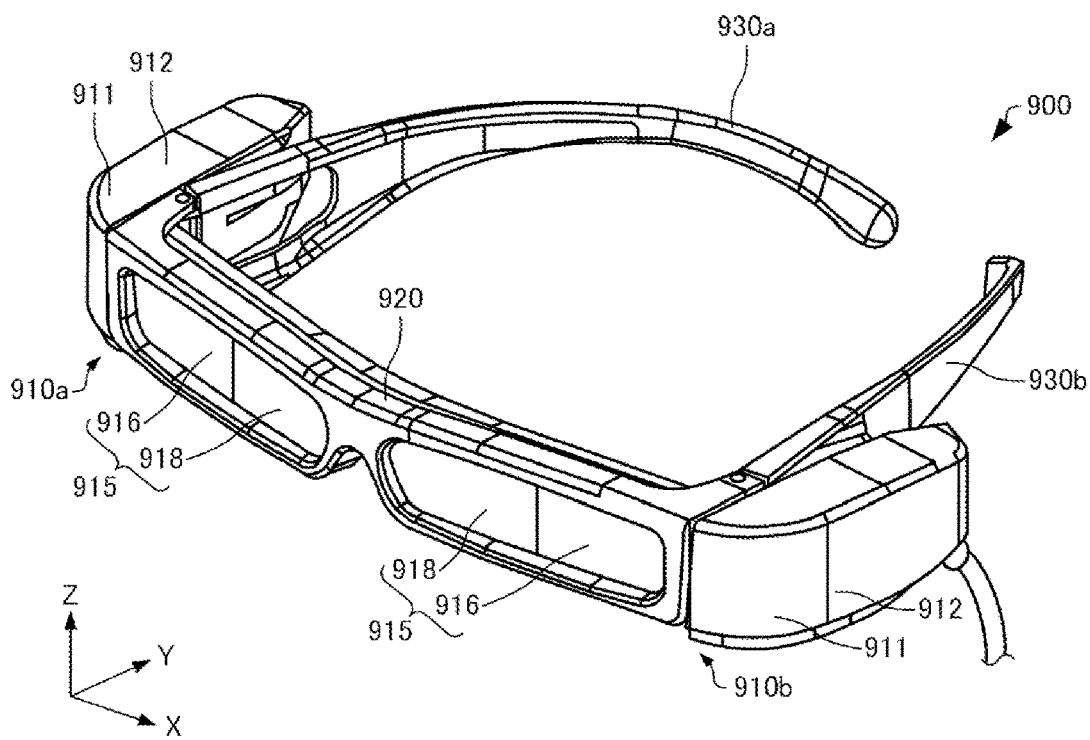
FIG. 30 is a perspective view schematically illustrating a head-mounted display according to a sixth embodiment.

Next, a head-mounted display according to a sixth embodiment will be described with reference to the drawings. FIG. 30 is a perspective view schematically illustrating a head-mounted display 900 according to the sixth embodiment. Note that, in FIG. 30, the X-axis, the Y-axis, and the Z-axis are illustrated as three axes perpendicular to each other.

The head-mounted display 900 is a head-mount type display device having an external appearance like eyeglasses, as illustrated in FIG. 30. The head-mounted display 900 is mounted at a head of an observer. The observer represents a user who uses the head-mounted display 900. The head-mounted display 900 is able to cause an observer to visually recognize image light made of a virtual image, and also to visually recognize an external image in a see-through manner. The head-mounted display 900 may also be referred to as a virtual image display device.

The head-mounted display 900 includes, for example, a first display unit 910a, a second display unit 910b, a frame 920, a first temple 930a, and a second temple 930b.

The first display unit 910a and the second display unit 910b display images. Specifically, the first display unit 910a displays a virtual image for a right eye of the observer. The second display unit 910b displays a virtual image for a left eye of the observer. In the example illustrated in the drawing, the first display unit 910a is provided in the −X-axis direction from the second display unit 910b. The display units 910a and 910b each include, for example, an image forming device 911 and a light-guiding device 915.

The image forming device 911 forms imaging light. The image forming device 911 includes, for example, an optical system such as a light source and a projection device, and an external member 912. The external member 912 accommodates the light source and the projection device.

The light-guiding device 915 covers the front of an eye of the observer. The light-guiding device 915 guides the image light formed at the image forming device 911, and also causes the external light and the image light to overlap with each other to cause the observer to visually recognize it. Note that details of the image forming device 911 and the light-guiding device 915 will be described later.

The frame 920 supports the first display unit 910a and the second display unit 910b. The frame 920 surrounds, for example, the display units 910a and 910b as viewed from the Y-axis direction. In the example illustrated in the drawing, the image forming device 911 of the first display unit 910a is attached at an end portion of the frame 920 at the −X-axis direction. The image forming device 911 of the second display unit 910b is attached at an end portion of the frame 920 at the +X-axis direction.

The first temple 930a and the second temple 930b each extends from the frame 920. In the example illustrated in the drawing, the first temple 930a extends toward the +Y-axis direction from an end portion of the frame 920 at the −X-axis direction. The second temple 930b extends toward the +Y-axis direction from an end portion of the frame 920 at the +X-axis direction.

The first temple 930a and the second temple 930b are each hooked over an ear of the observer when the observer wears the head-mounted display 900. The head of the observer is located between the temples 930a and 930b.

6.2. Image Forming Device and Light-Guiding Device

Figure 31:
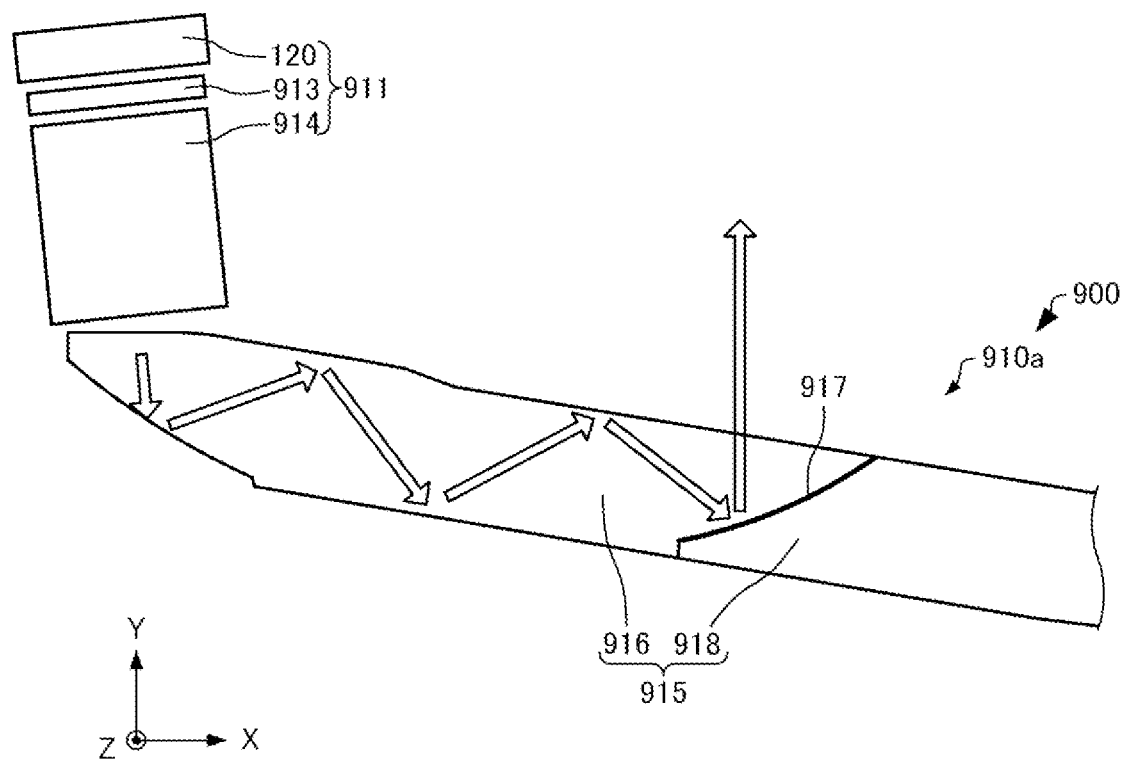
FIG. 31 is a diagram schematically illustrating an image forming device and a light-guiding device of the head-mounted display according to the sixth embodiment.

FIG. 31 is a diagram schematically illustrating the image forming device 911 and the light-guiding device 915 of the first display unit 910a of the head-mounted display 900. Note that the first display unit 910a and the second display unit 910b basically have the same configuration. Thus, it is possible to apply description of the first display unit 910a below to the second display unit 910b.

The image forming device 911 includes, for example, the light-emitting device 120 serving as a light source, an optical modulation device 913, and a projection device 914 for forming an image, as illustrated in FIG. 31.

The optical modulation device 913 modulates light entered from the light-emitting device 120 in accordance with image information, and outputs image light. The optical modulation device 913 is a transmissive-type liquid crystal light valve. Note that the light-emitting device 120 may be a self-light emission type light-emitting device configured to emit light in accordance with inputted image information. In this case, the optical modulation device 913 is not provided.

The projection device 914 projects the image light outputted from the optical modulation device 913 toward the light-guiding device 915. The projection device 914 is, for example, a projection lens. As for the lens that constitutes the projection device 914, it may be possible to use a lens in which an axisymmetrical surface is used as a lens surface.

The light-guiding device 915 is, for example, screwed to a lens tube of the projection device 914 to be accurately positioned relative to the projection device 914. The light-guiding device 915 includes, for example, an image-light guiding member 916 configured to guide the image light, and a see-through member 918 used to perform see-through.

The image light outputted from the projection device 914 enters the image-light guiding member 916. The image-light guiding member 916 is a prism configured to guide the image light toward an eye of the observer. The image light that has entered the image-light guiding member 916 repeats reflection at the inner surface of the image-light guiding member 916, and then, is reflected at the reflection layer 917 to be outputted from the image-light guiding member 916. The image light outputted from the image-light guiding member 916 reaches an eye of the observer. In the example illustrated in the drawing, the reflection layer 917 reflects the image light in the +Y-axis direction. The reflection layer 917 is comprised, for example, of metal or a dielectric multilayer film. The reflection layer 917 may be a half mirror.

The see-through member 918 is adjacent to the image-light guiding member 916. The see-through member 918 is fixed to the image-light guiding member 916. The outer front surface of the see-through member 918 continues, for example, to the outer front surface of the image-light guiding member 916. The see-through member 918 causes the observer to see the external light in a see-through manner. Note that, in addition to the function of guiding the image light, the image-light guiding member 916 also has a function of causing the observer to see the external light in a see-through manner.

The light-emitting device according to the embodiments described above can be used for applications other than the projector, the display, and the head-mounted display. The light-emitting device according to the embodiments described above is used as a light source of, for example, indoor and outdoor lighting, a laser printer, a scanner, a vehicle mounted light, a sensing unit using light, or a communication device.

The embodiments and modification examples described above are merely examples, and the present disclosure is not limited to these. For example, it is possible to combine individual embodiments and individual modification examples as appropriate.

The present disclosure includes substantially the same configuration as the configuration described in the embodiments, for example, a configuration having the same function, method, and result or a configuration having the same advantage and effect. In addition, the present disclosure includes a configuration in which non-essential portions of the configurations described in the embodiments are replaced. Furthermore, the present disclosure includes a configuration that provides the same operation and effect as those of the configuration described in the embodiments or a configuration that can achieve the same advantage. In addition, the present disclosure includes a configuration in which a known technique is added to the configuration described in the embodiments.

The following details are derived from the embodiments and the modification examples described above.

An aspect of the light-emitting device includes: a first electrode; a second electrode; a first semiconductor layer provided between the first electrode and the second electrode and having a first electric conductivity type; a second semiconductor layer provided between the first semiconductor layer and the second electrode and having a second electric conductivity type different from the first electric conductivity type; a light-emitting layer provided between the first semiconductor layer and the second semiconductor layer; an insulating layer provided along a side surface of the first semiconductor layer; and a metal layer provided in contact with the insulating layer and along the side surface of the first semiconductor layer and configured to reflect light generated at the light-emitting layer, in which the light generated at the light-emitting layer is outputted from a side of the first electrode, the metal layer includes a first end in a first direction directed from the light-emitting layer toward the first semiconductor layer, the first semiconductor layer includes a second end in the first direction, and in the first direction, a position of the first end is equal to a position of the second end or the position of the first end is on the first direction side with respect to the position of the second end.

With this light-emitting device, it is possible to achieve miniaturization.

In one aspect of the light-emitting device, a contact surface of the first electrode with the first semiconductor layer may be provided at an inner side of an outer edge of the first semiconductor layer as viewed from the first direction.

With this light-emitting device, it is possible to reduce a current flowing through a side surface of the first semiconductor layer.

In one aspect of the light-emitting device, the contact surface may be provided at an inner side of an outer edge of the light-emitting layer as viewed from the first direction.

With this light-emitting device, it is possible to reduce a current flowing through a side surface of the first semiconductor layer.

In one aspect of the light-emitting device, the insulating layer may be further provided at a side surface of the light-emitting layer and a side surface of the second semiconductor layer, and the metal layer may be coupled to the second electrode.

With this light-emitting device, it is possible to cause the metal layer to reflect light passing through a side surface of the second semiconductor layer.

In one aspect of the light-emitting device, the light-emitting layer and the second semiconductor layer may constitute a plurality of column portions.

With this light-emitting device, it is possible to output laser light.

One aspect of a projector includes one aspect of the light-emitting device.

One aspect of a display includes one aspect of the light-emitting device.

One aspect of a head-mounted display includes one aspect of the light-emitting device.

What is claimed is:
1. A light-emitting device comprising:
a first electrode;
a second electrode;

a first semiconductor layer provided between the first electrode and the second electrode and having a first electric conductivity type;

a second semiconductor layer provided between the first semiconductor layer and the second electrode and having a second electric conductivity type different from the first electric conductivity type;

a light-emitting layer provided between the first semiconductor layer and the second semiconductor layer;

an insulating layer provided along a side surface of the first semiconductor layer and between the first electrode and the second electrode; and a metal layer provided in contact with the insulating layer and along the side surface of the first semiconductor layer and configured to reflect light generated at the light-emitting layer, wherein the light generated at the light-emitting layer is outputted from a side of the first electrode, the metal layer includes a first end in a first direction directed from the light-emitting layer toward the first semiconductor layer, the first semiconductor layer includes a second end in the first direction, and in the first direction, a position of the first end is the same as or different from a position of the second end.

2. The light-emitting device according to claim 1, wherein a contact surface of the first electrode with the first semiconductor layer is provided at an inner side of an outer edge of the first semiconductor layer as viewed from the first direction.

3. The light-emitting device according to claim 2, wherein the contact surface is provided at an inner side of an outer edge of the light-emitting layer as viewed from the first direction.

4. The light-emitting device according to claim 1, wherein the insulating layer is further provided at a side surface of the light-emitting layer and a side surface of the second semiconductor layer and the metal layer is coupled to the second electrode.

5. The light-emitting device according to claim 1, wherein the light-emitting layer and the second semiconductor layer constitute a plurality of column portions.

6. A projector comprising the light-emitting device according to claim 1.

7. A display comprising the light-emitting device according to claim 1.

8. A head-mounted display comprising the light-emitting device according to claim 1.

9. A light-emitting device comprising:

a first electrode;

a second electrode;

a first semiconductor layer provided between the first electrode and the second electrode and having a first electric conductivity type;

a second semiconductor layer provided between the first semiconductor layer and the second electrode and having a second electric conductivity type different from the first electric conductivity type;

a light-emitting layer provided between the first semiconductor layer and the second semiconductor layer;

an insulating layer provided along a side surface of the first semiconductor layer; and a metal layer provided in contact with the insulating layer and configured to reflect light generated at the light-emitting layer, the metal layer provided along the side surface of the first semiconductor layer and along a side surface of the second semiconductor layer, wherein the light generated at the light-emitting layer is outputted from a side of the first electrode, the metal layer includes a first end in a first direction directed from the light-emitting layer toward the first semiconductor layer, the first semiconductor layer includes a second end in the first direction, and in the first direction, a position of the first end is the same as or different from a position of the second end.

* * * * *